(12) United States Patent
Nourbakhsh et al.

(10) Patent No.: US 11,508,734 B2
(45) Date of Patent: *Nov. 22, 2022

(54) INTEGRATED ASSEMBLIES, AND METHODS OF FORMING INTEGRATED ASSEMBLIES

(71) Applicant: Micron Technology, Inc., Boise, ID (US)

(72) Inventors: Amirhasan Nourbakhsh, Boise, ID (US); John K. Zahurak, Eagle, ID (US); Sanh D. Tang, Kuna, ID (US); Silvia Borsari, Boise, ID (US); Hong Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 7 days.

This patent is subject to a terminal disclaimer.

(21) Appl. No.: 17/119,129

(22) Filed: Dec. 11, 2020

(65) Prior Publication Data

US 2021/0098463 A1   Apr. 1, 2021

Related U.S. Application Data

(60) Continuation of application No. 16/831,355, filed on Mar. 26, 2020, now Pat. No. 10,886,282, which is a (Continued)

(51) Int. Cl.
*H01L 27/108* (2006.01)
*H01L 29/78* (2006.01)
*H01L 29/66* (2006.01)

(52) U.S. Cl.
CPC .. *H01L 27/10876* (2013.01); *H01L 27/10814* (2013.01); *H01L 27/10823* (2013.01); (Continued)

(58) Field of Classification Search
CPC ......... H01L 27/10814; H01L 27/10855; H01L 27/10808; H01L 27/10876; (Continued)

(56) References Cited

U.S. PATENT DOCUMENTS 10,461,185 B2   10/2019   Tang et al.
10,886,282 B2 *  1/2021   Nourbakhsh ..... H01L 27/10891
(Continued)

*Primary Examiner* — Lawrence C Tynes, Jr.
(74) *Attorney, Agent, or Firm* — Wells St. John P.S.

(57) ABSTRACT

Some embodiments include an integrated assembly having digit lines extending along a first direction, and rails over the digit lines. The rails include semiconductor-material pillars alternating with intervening insulative regions. The rails have upper, middle and lower segments. A first insulative material is along the upper and lower segments of the rails. A second insulative material is along the middle segments of the rails. The second insulative material differs from the first insulative material in one or both of thickness and composition. Conductive gate material is along the middle segments of the rails and is spaced from the middle segments by the second insulative material. Channel regions are within the middle segments of the pillars, upper source/drain regions are within the upper segments of the pillars and lower source/drain regions are within the lower segments of the pillars. Some embodiments include methods of forming integrated assemblies.

19 Claims, 25 Drawing Sheets

Related U.S. Application Data division of application No. 16/152,129, filed on Oct. 4, 2018, now Pat. No. 10,615,165.

(52) U.S. Cl.
CPC .. *H01L 27/10855* (2013.01); *H01L 27/10891* (2013.01); *H01L 29/66666* (2013.01); *H01L 29/7827* (2013.01)

(58) Field of Classification Search
CPC ....... H01L 27/10823; H01L 27/10873–10879; H01L 27/10826; H01L 29/7827; H01L 29/66666; H01L 29/78642; H01L 29/66712–66734; H01L 29/7802–7815
See application file for complete search history.

(56) References Cited

U.S. PATENT DOCUMENTS

| | | | |
|---|---|---|---|
| 2012/0126884 A1 | 5/2012 | Juengling | |
| 2012/0313067 A1* | 12/2012 | Lee | H01L 45/144 |
| | | | 257/E45.001 |
| 2020/0111797 A1* | 4/2020 | Li | H01L 27/10808 |

* cited by examiner

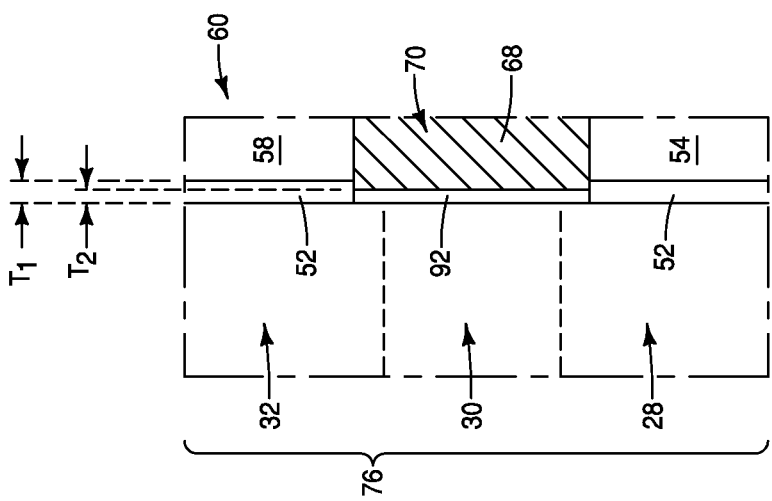
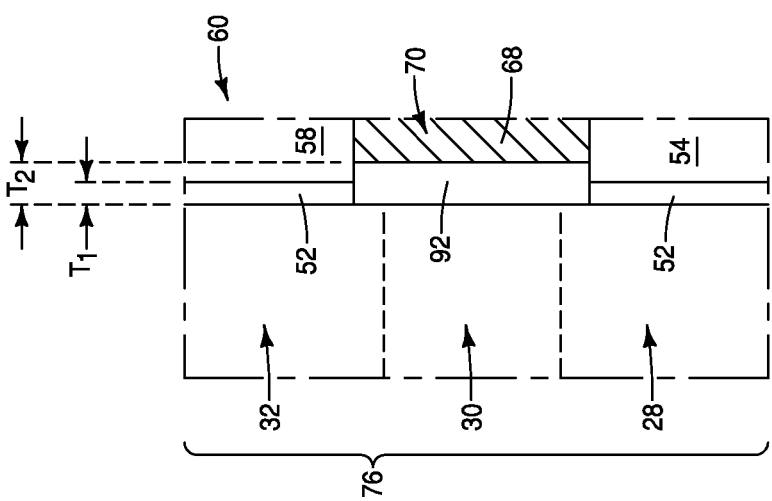

INTEGRATED ASSEMBLIES, AND METHODS OF FORMING INTEGRATED ASSEMBLIES

RELATED PATENT DATA

This patent resulted from a continuation of U.S. patent application Ser. No. 16/831,355 which was filed Mar. 26, 2020, which is a divisional of U.S. patent application Ser. No. 16/152,129 which was filed Oct. 4, 2018, each of which is hereby incorporated by reference herein.

TECHNICAL FIELD

Integrated assemblies, such as, for example, dynamic random-access memory assemblies; and methods of forming integrated assemblies.

BACKGROUND

Integrated circuitry may include vertically-extending pillars of semiconductor material. Such pillars may be arranged in an array. The array may be considered to comprise rows and columns; with the columns crossing the rows.

The pillars may be incorporated into transistors. The transistors may comprise conductive gates along the pillars. Conductive wordlines may extend along the rows of the array, and may be electrically coupled with the conductive gates of the transistors.

The transistors may be incorporated into memory/storage, logic, sensors and/or any other suitable application. For instance, the transistors may be coupled with charge-storage devices (e.g., capacitors), and thereby incorporated into memory cells of dynamic random-access memory (DRAM).

A continuing goal of integrated circuit fabrication is to increase integration density, and an associated goal is to scale devices to increasingly smaller dimensions. It would be desirable to develop improved methods for fabricating the above-described transistors, and to develop new architectures comprising such transistors.

BRIEF DESCRIPTION OF THE DRAWINGS

FIG. 2 is a diagrammatic top view. FIG. 3 is a diagrammatic cross-sectional side view along the lines 3-3 of FIGS. 2 and 4. FIG. 4 is a diagrammatic cross-sectional side view along the lines 4-4 of FIGS. 2 and 3.

FIG. 5 is a diagrammatic top view. FIG. 6 is a diagrammatic cross-sectional side view along the lines 6-6 of FIGS. 5 and 7. FIG. 7 is a diagrammatic cross-sectional side view along the lines 7-7 of FIGS. 5 and 6.

FIGS. 25 and 26 are diagrammatic cross-sectional side views of a region of an example assembly showing example configurations alternative to that of FIG. 23.

DETAILED DESCRIPTION OF THE ILLUSTRATED EMBODIMENTS

Some embodiments include methods of recessing a material within trenches until an upper surface of the material is at a first level corresponding to a desired level of the tops of conductive structures. Insulative spacers are then formed over the recessed material, with bottoms of the spacers being calibrated to the first level by the recessed material. Subsequently, the material is recessed to a second level corresponding to a desired level of bottoms of the conductive structures. The conductive structures are formed to extend from the bottoms of the spacers to a top of the material at the second level, and accordingly tops of the conductive structures are calibrated to the first level and bottoms of the conductive structures are calibrated to the second level. In some embodiments, the conductive structures are gates of vertical transistors; with the gates being spaced from channel regions of the vertical transistors by gate dielectric material. In some embodiments, the gate dielectric material is along a middle segment of the vertical transistors. A second material may be both above and below the gate dielectric material along the vertical transistors. The gate dielectric material may vary from the second material in one or both of composition and thickness. Example embodiments are described with reference to FIGS. 1-26.

Figure 1:
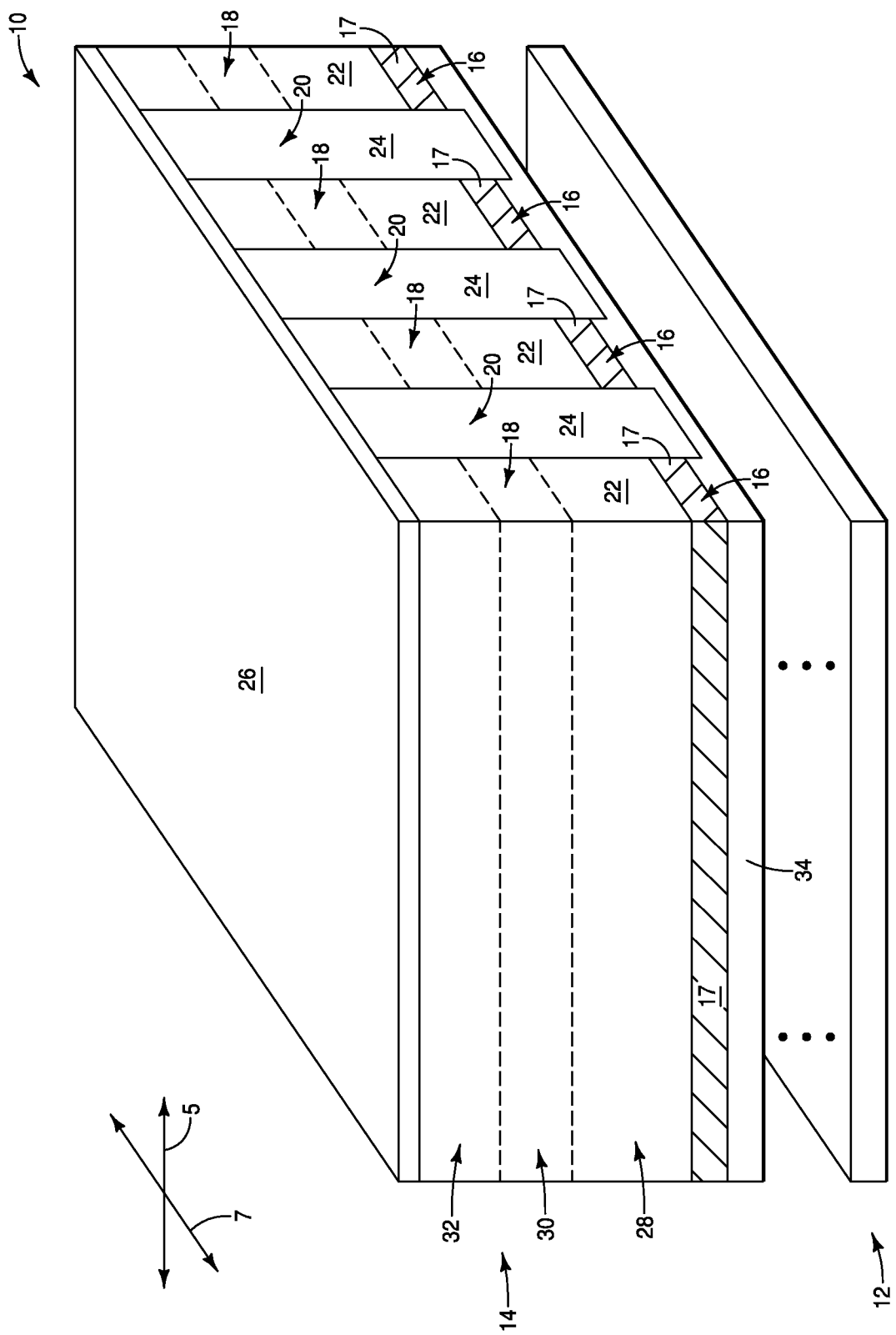
FIG. 1 is a diagrammatic three-dimensional view of an example assembly at an example process stage.

Referring to FIG. 1, an assembly (i.e., construction) 10 comprises a structure 14 supported by a base 12. The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc. A gap is provided between the substrate 12 and the structure 14 to indicate that there may be other materials, circuitry, etc., between the base 12 and the structure 14. For instance, insulative material may be provided between the structure 14 and the base 12.

The structure 14 comprises a plurality of conductive lines 16 which extend along a first direction, with the first direction being diagrammatically indicated with an axis 5. In some embodiments, the conductive lines 16 may be incorporated into digit lines.

The conductive lines 16 comprise conductive material 17. Such conductive material may comprise any suitable electrically conductive composition(s); and in some embodiments may, for example, include one or more of various metals (e.g., titanium, tungsten, cobalt, nickel, ruthenium, platinum, etc.), metal-containing compositions (e.g., metal silicide, metal nitride, metal carbide, etc.), and/or conductively-doped semiconductor materials (e.g., conductively-doped silicon, conductively-doped germanium, etc.).

First panels 18 are directly over the conductive lines 16, and extend along the first direction of axis 5. Second panels 20 are adjacent to the first panels 18. The first and second panels 18 and 20 alternate with one another along a second direction, with the second direction being diagrammatically illustrated with an axis 7. The second direction represented by the axis 7 crosses the first direction represented by the axis 5. In some embodiments, the second direction represented by the axis 7 may be substantially orthogonal to the first direction represented by the axis 5, with the term "substantially orthogonal" meaning orthogonal to within reasonable tolerances of fabrication and measurement.

The first panels 18 comprise semiconductor material 22, and the second panels 20 comprise insulative material 24.

The semiconductor material 22 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the semiconductor material 22 may comprise, consist essentially of, or consist of silicon. The silicon may comprise any suitable crystallographic configuration; and in some embodiments may be monocrystalline silicon, polycrystalline silicon, etc.

The insulative material 24 may comprise any suitable composition(s); and in some embodiments may comprise, consist essentially of, or consist of silicon dioxide.

The panels 18 and 20 may be representative of a large number of panels formed across the structure 14 during fabrication of integrated circuitry. For instance, the panels may be representative of a large number of panels utilized during the fabrication of integrated memory (e.g., DRAM).

Protective material 26 is formed over the structure 14, and specifically is formed over the first and second panels 18 and 20. The protective material 26 may comprise any suitable composition(s); and in some embodiments may comprise, consist essentially of, or consist of silicon nitride. The protective material 26 may comprise any suitable thickness, and in some embodiments may comprise a thickness within a range of from about 200 angstroms (Å) to about 500 Å.

The semiconductor material 22 of the first panels 18 is subdivided amongst three portions 28, 30 and 32. Dashed lines are provided to diagrammatically indicate approximate boundaries between the three portions. The top and bottom portions 28 and 32 may be appropriately doped to be incorporated into source/drain regions of vertical transistors (e.g., may be doped to a concentration of at least about $10^{21}$ atoms/cm$^3$ with conductivity-enhancing dopant), and the middle portion 30 may be appropriately doped to be incorporated into channel regions of the vertical transistors (and in some embodiments may be undoped, or intrinsically doped). The portions 28, 30 and 32 may be doped to desired levels within the shown assembly 10 of FIG. 1; or at least one of the portions 28, 30 and 32 may doped at a subsequent process stage.

An insulative material 34 is under the panels 18 and 20. The insulative material 34 may comprise any suitable composition(s), and in some embodiments may comprise, consist essentially of, or consist of silicon dioxide. The insulative material 34 may comprise a same composition as the insulative panels 20 in some embodiments, and may comprise a different composition relative to the insulative panels 20 in other embodiments.

The assembly 10 of FIG. 1 may be fabricated with any suitable processing. Persons ordinary skill in the art will recognize suitable methods for fabricating such assembly.

Figure 2:
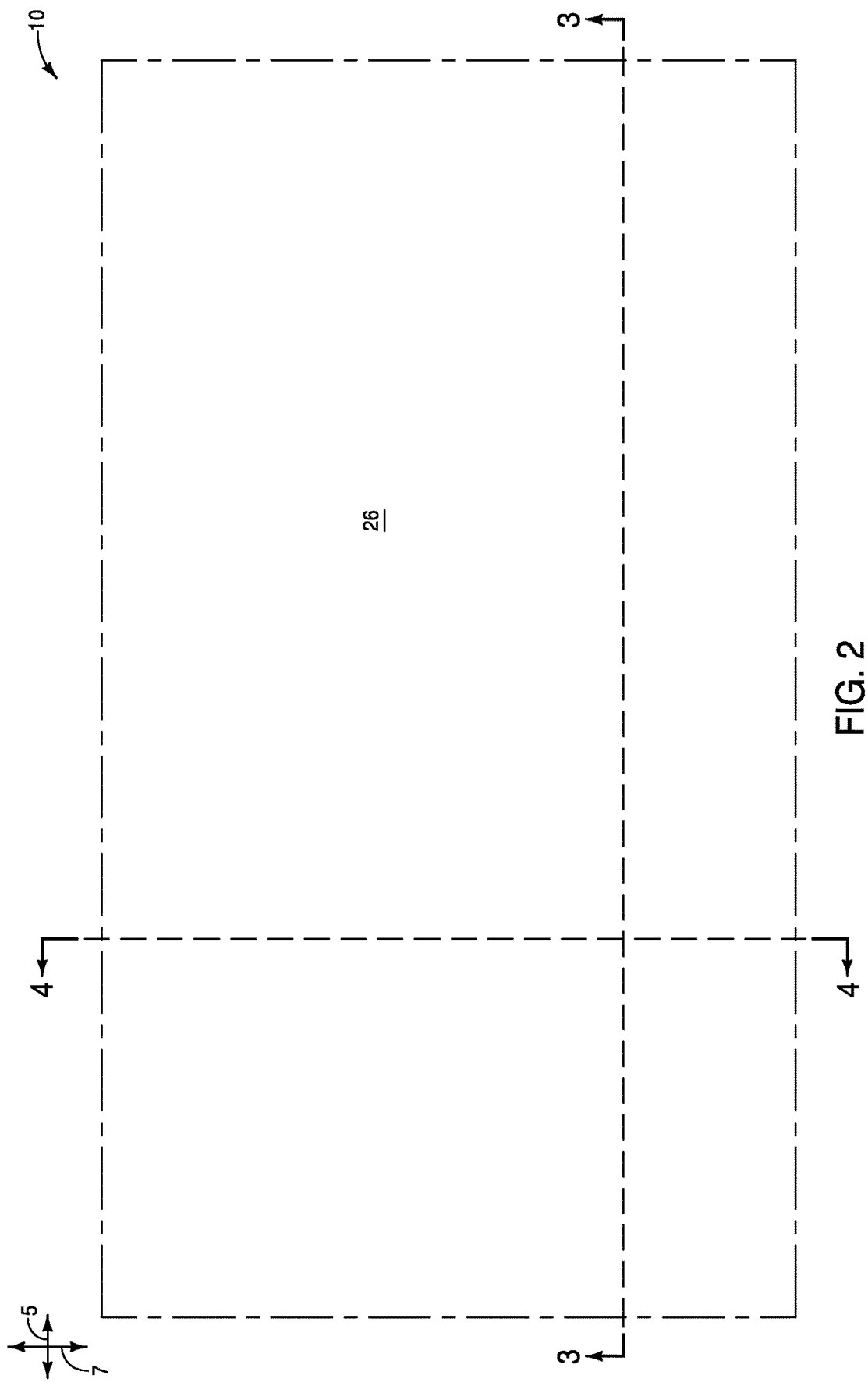
FIGS. 2-4 are two-dimensional views of the assembly of FIG. 1.
Figure 3:
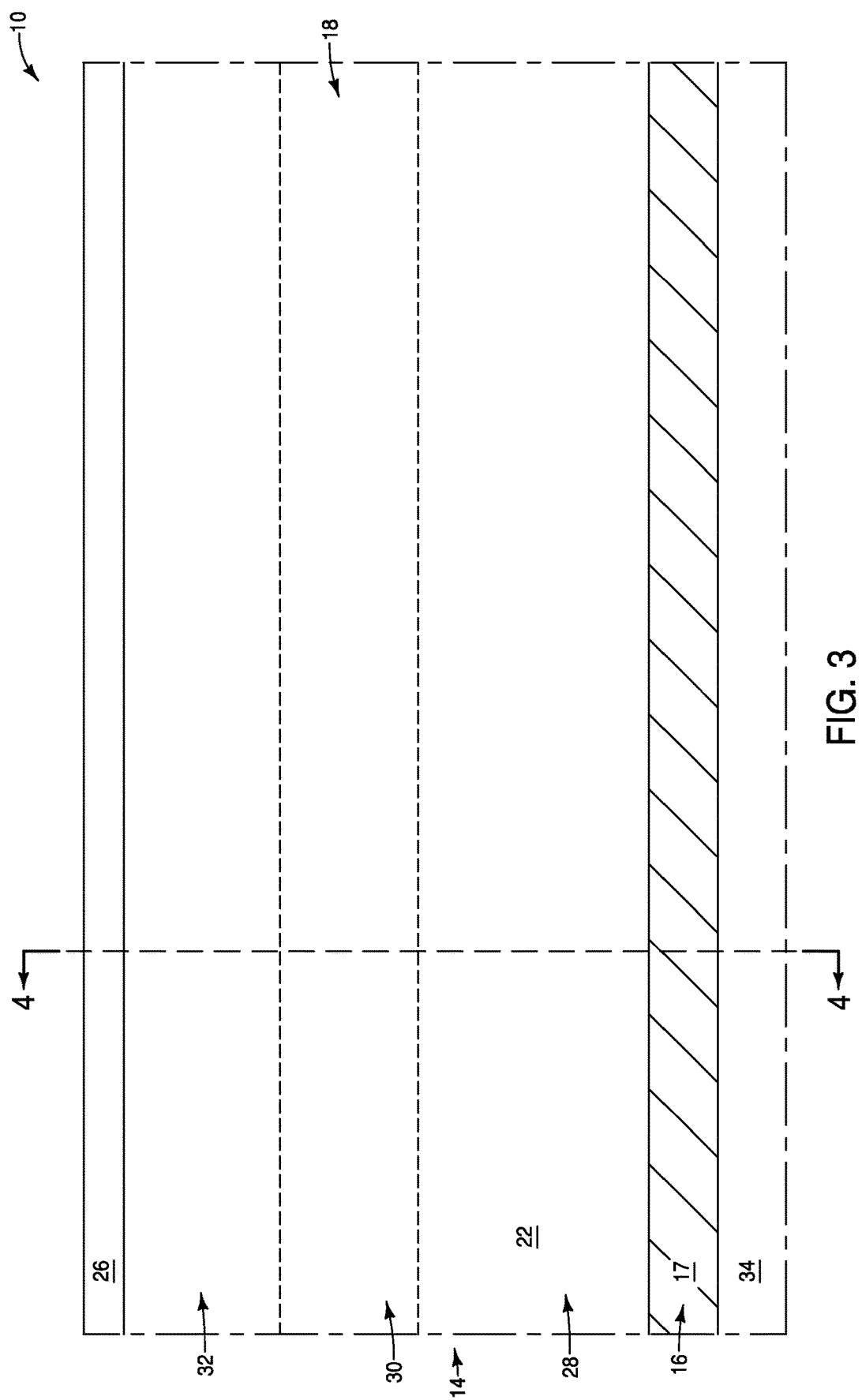
Figure 4:
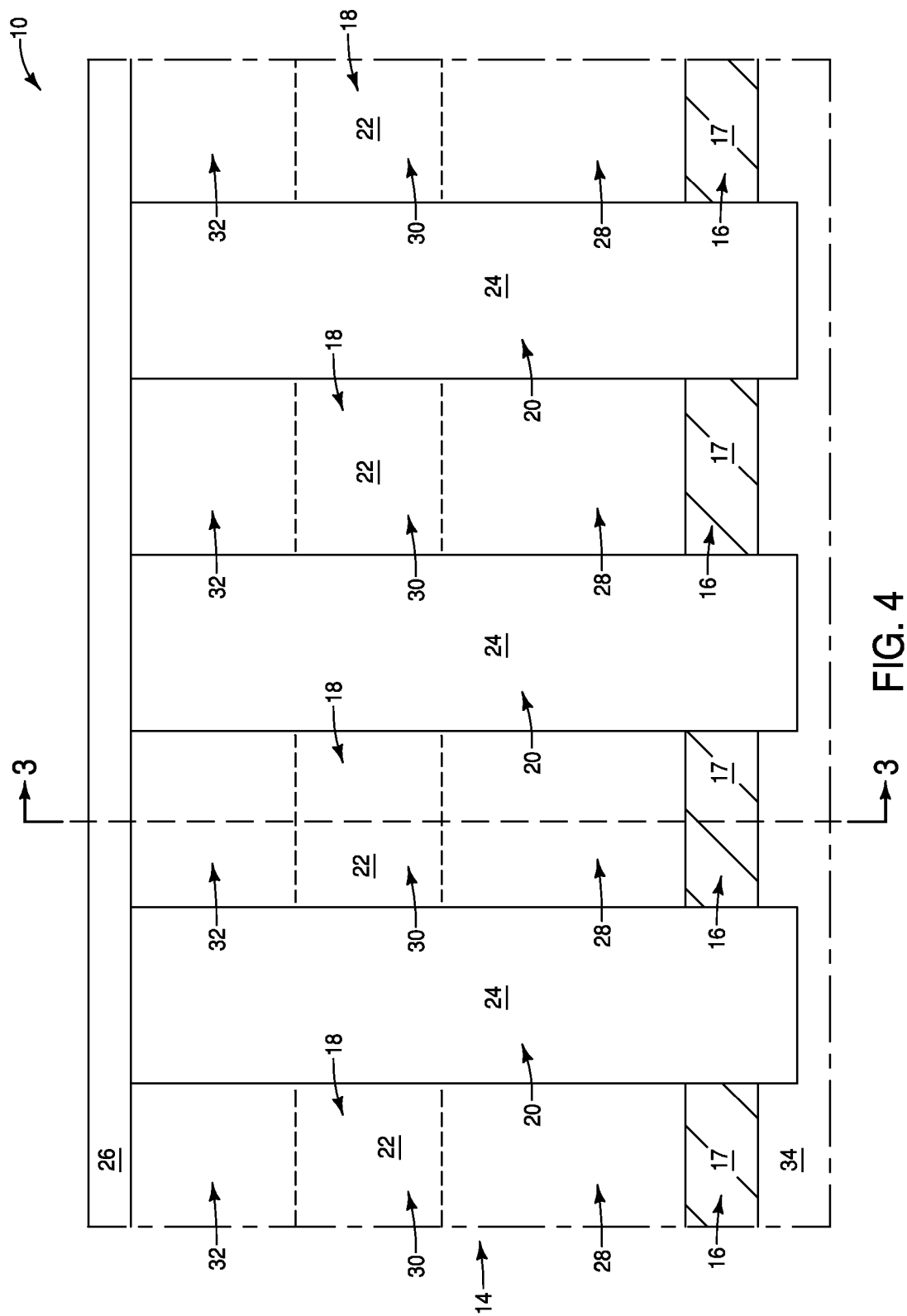

The three-dimensional view of FIG. 1 is helpful for explaining the relationship between the panels 18 and 20, and the relationship between the structure 14 and the underlying base 12. However, methodology of the present invention may be easier to describe using two-dimensional views rather than with three-dimensional views. Accordingly, FIGS. 2-4 are provided to illustrate construction 10 with two-dimensional views. FIG. 2 shows a top view of construction 10, and FIGS. 3 and 4 show cross-sectional side views along the lines 3-3 and 4-4 of FIG. 2, respectively. The underlying base 12 is not shown in FIGS. 2-4 (or any of the other two-dimensional views which follow) in order to simplify the drawings, but it is to be understood that the appropriate base may be provided to support the illustrated structures.

Figure 5:
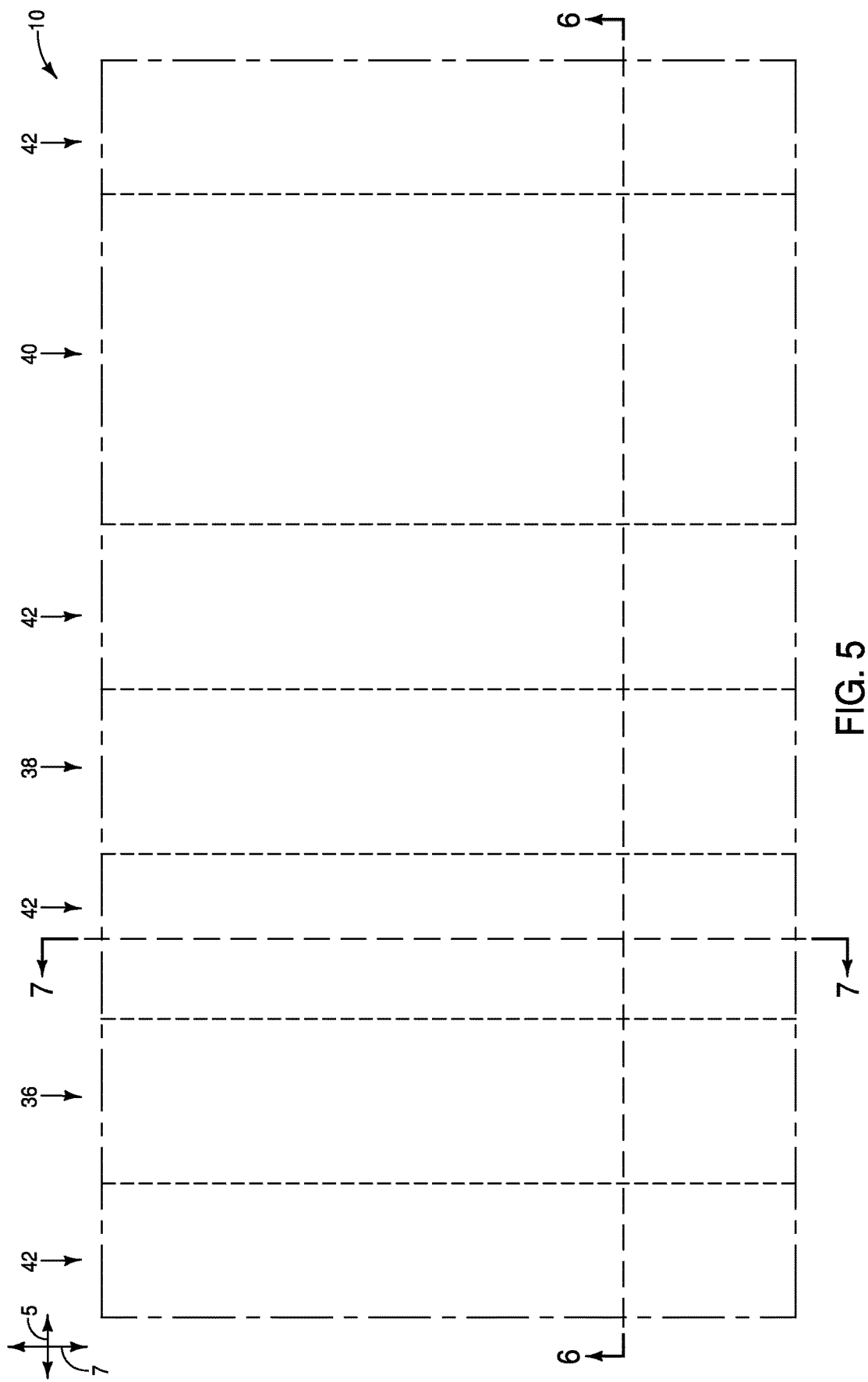
FIGS. 5-7 are views of the assembly of FIGS. 2-4 at an example processing stage subsequent to that of FIGS. 2-4.
Figure 6:
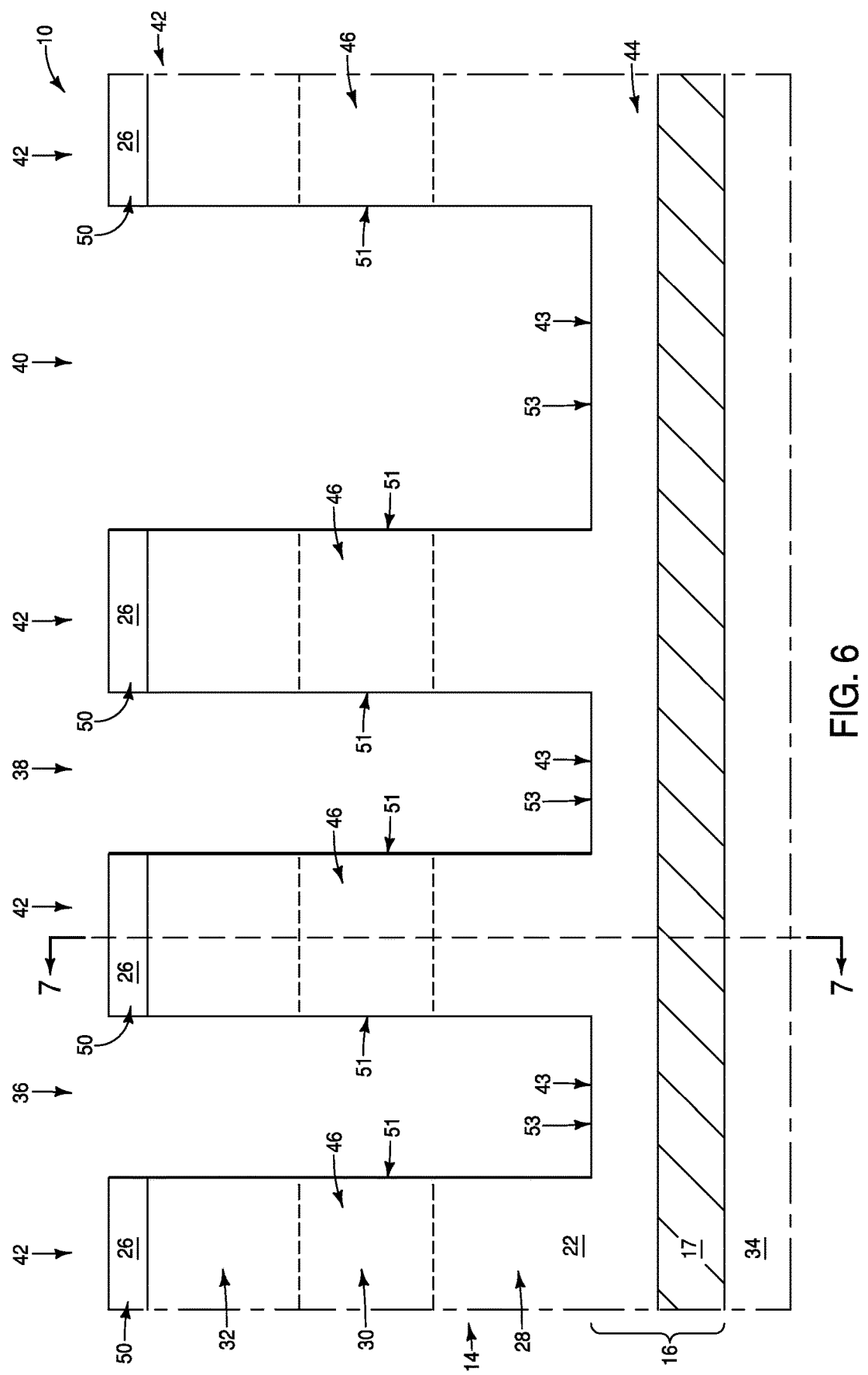
Figure 7:
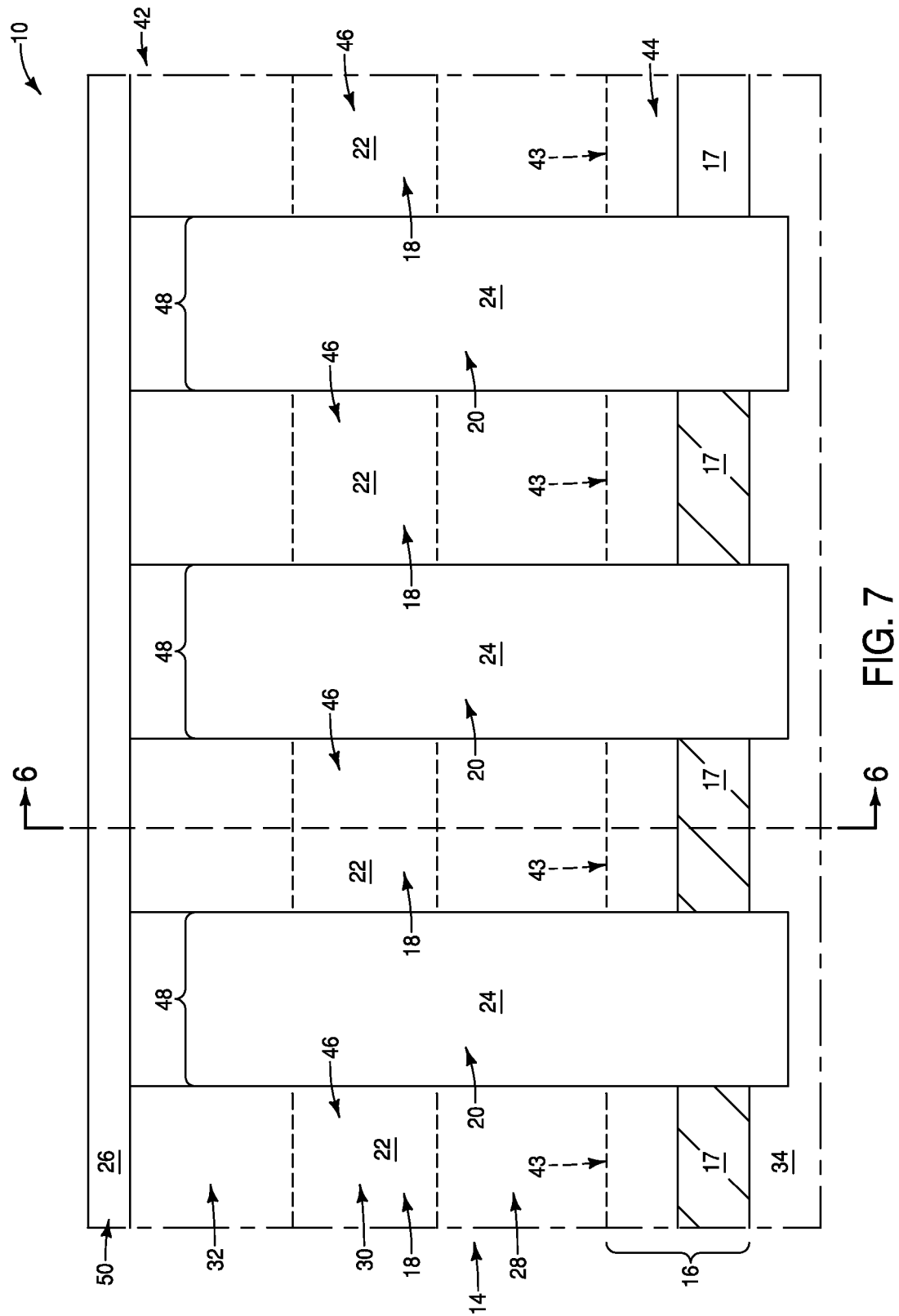

Referring to FIGS. 5-7, trenches 36, 38 and 40 are formed to extend through the protective material 26 and into the structure 14. The trenches may be formed with any suitable processing. For instance, a patterned mask (not shown) may be utilized to define locations of the trenches, and then the trenches may be formed with one or more suitable etches. The mask may be subsequently removed to leave the construction of FIGS. 5-7. In the shown embodiment, the trench 40 has a greater width than the trenches 36 and 38 (as shown, for example, along the cross-section of FIG. 6). Such may be purposeful in some embodiments, or may result from undesired errors during patterning and/or etching. It may be difficult to form desired gate structures within trenches of varying widths with conventional processing. In contrast, methodology of the present invention can form desired gate structures within all of the trenches 36, 38 and 40, regardless of the variation in width amongst such trenches; as is shown below in subsequent figures.

The trenches 36, 38 and 40 may be representative of a large number of trenches formed across a structure during fabrication of integrated circuitry. For instance, the trenches may be representative of a large number of trenches utilized during the fabrication of integrated memory.

The trenches 36, 38 and 40 extend along the second direction of axis 7. Upper portions of the structure 14, together with the protective material 26 over such upper portions, are patterned into rails 42; with such rails extending along the second direction of axis 7. The cross-section of FIG. 7 is along one of the rails 42. The semiconductor material 22 within the rails is configured as vertically-extending pillars 46. The pillars 46 within each of the rails 42 are spaced from one another by insulative regions 48 comprising the insulative material 24 (as shown in FIG. 7).

The trenches 36, 38 and 40 have interior surfaces which include sidewall surfaces 51 and bottom surfaces 53.

Lower portions of the semiconductor material 22 remains under the rails 42 and the trenches 36, 38 and 40, with such lower portions being configured as lines 44 passing under the trenches and the vertically-extending pillars 46. The lines 44 have upper surfaces 43 in the trenches 36, 38 and 40; and approximate locations of such upper surfaces are diagrammatically illustrated in FIG. 7 to assist the reader in visualizing the lines 44 extending in and out of the page relative to the cross-section of FIG. 7. The lines 44 are eventually conductively doped, and in some embodiments may be considered to be additional portions of the digit lines 16.

The bottom surfaces 53 of the trenches 36, 38 and 40 are coextensive with the top surfaces 43 of the semiconductor-containing lines 44.

In some embodiments, the protective material 26 within the rails 42 may be considered to be configured as protective caps 50 which extend over the pillars 46, and over the insulative regions 48 between the pillars.

The processing steps described above are shown with multiple views (specifically, a first step is shown with the views of FIGS. 1-4, and a second step is shown with the views of FIGS. 5-7). The multiple views are provided to assist the reader in understanding three-dimensional relationships within the assemblies. The remaining process stages will be described with only single views (specifically, views along the same cross-section as FIGS. 3 and 6), as such single views will be sufficient for conveying relevant components of the invention(s) described herein.

Figure 8:
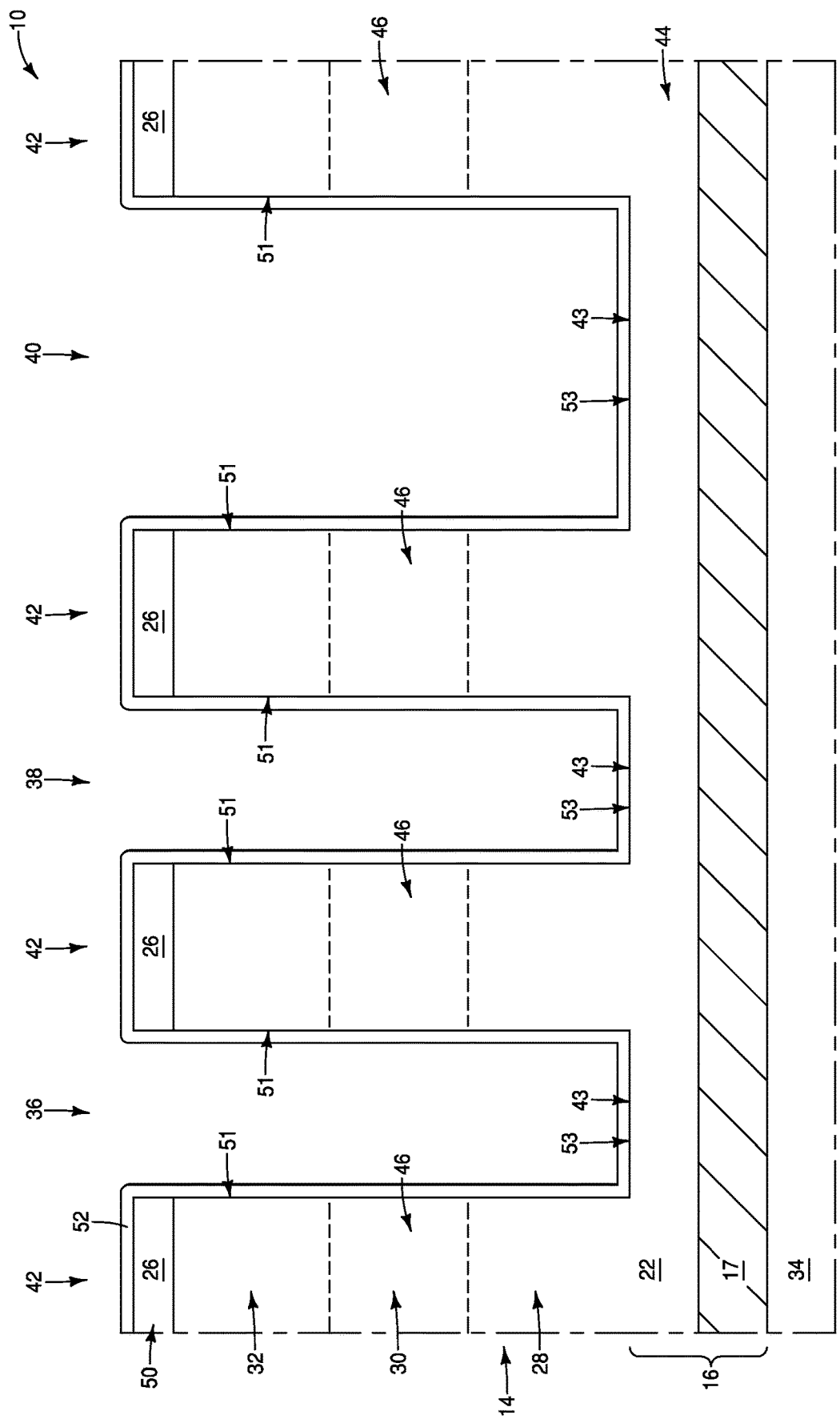
FIGS. 8-17 are diagrammatic cross-sectional side views along the same cross-section as FIG. 6 at example processing stages following that of FIG. 6.

Referring to FIG. 8, construction 10 is shown at a processing stage following that of FIG. 6. The processing stage of FIG. 8 shows a coating material 52 formed over the rails 42 and along the interior surfaces 51 and 53 of the trenches 36, 38 and 40. In some embodiments, the coating material 52 may be considered to line the interior surfaces 51 and 53 of the trenches.

The coating material 52 may comprise any suitable composition(s). In some embodiments, the coating material 52 may comprise high-k dielectric material (with the term high-k meaning a dielectric constant greater than that of silicon dioxide), low-k material (with the term low-k meaning a dielectric constant less than that of silicon oxide) and/or may comprise silicon dioxide. In some embodiments, the coating material 52 may comprise, consist essentially of, or consist of one or more of aluminum oxide, hafnium oxide, zirconium oxide, carbon-doped silicon nitride, boron-doped silicon nitride, carbon-doped silicon dioxide, etc.

The coating material 52 may be formed to any suitable thickness; and in some example embodiments may be formed to a thickness within a range of from about 10 Å to about 100 Å.

Figure 9:
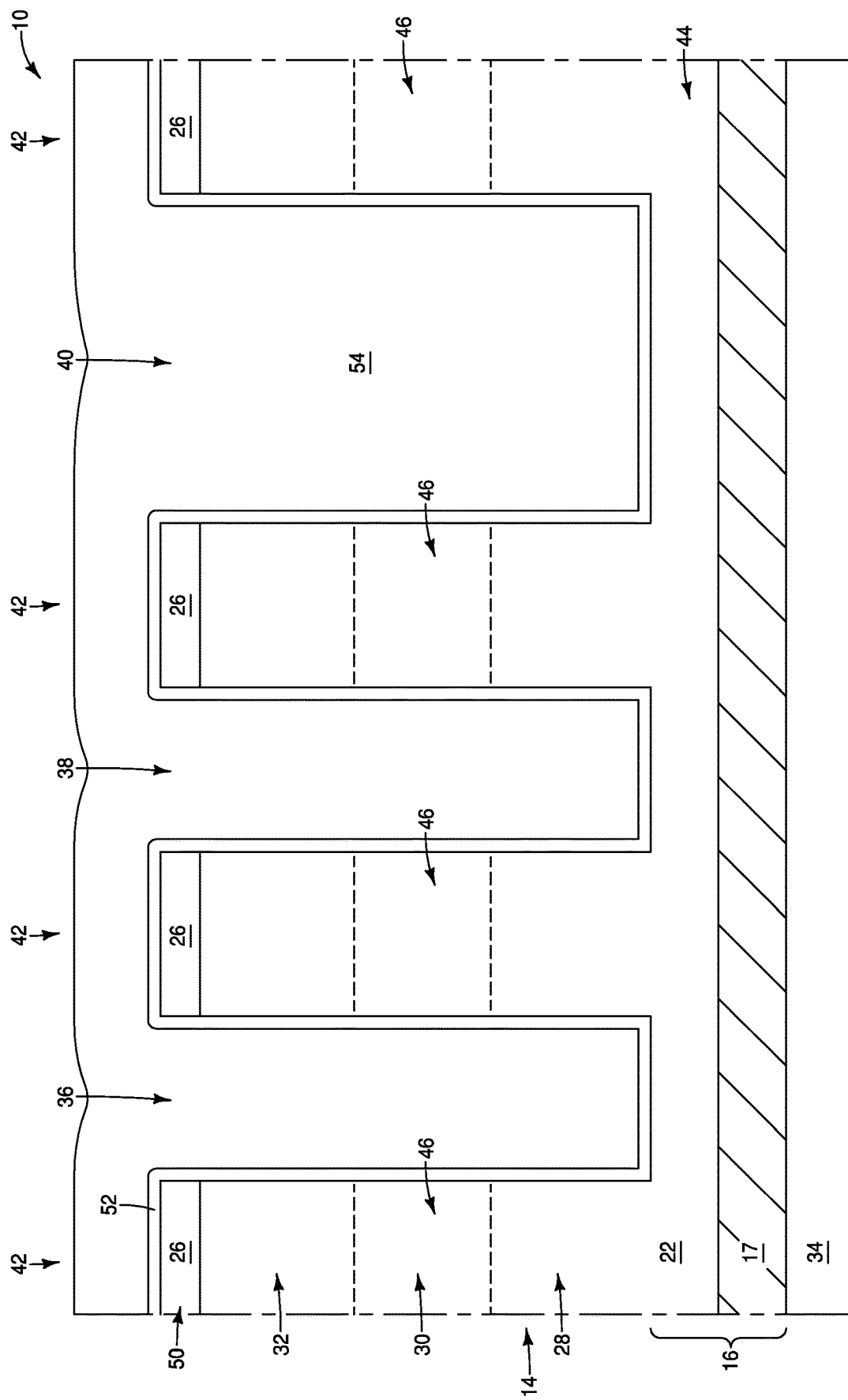

Referring to FIG. 9, a first material 54 is formed over the coating material 52. The first material 54 extends over the rails 42, and within the trenches 36, 38 and 40. The first material 54 may be chosen to be selectively etchable relative to the coating material 52. The term "selectively etchable" means that the first material is removed faster than the coating material under suitable etching conditions, which can include, but is not limited to, situations in which only the first material is removed under the suitable etching conditions (i.e., situations which are 100% selectable for the first material relative to the coating material). In some embodiments, the first material 54 may comprise, consist essentially of, or consist of silicon dioxide; while coating material 52 may comprise, consist essentially of, or consist of one or more of aluminum oxide, hafnium oxide, zirconium oxide, carbon-doped silicon nitride, boron-doped silicon nitride, carbon-doped silicon dioxide, etc.

The first material 54 may be deposited with any suitable process, and in some embodiments may be a spin-on dielectric (SOD) or a flowable oxide.

Figure 10:
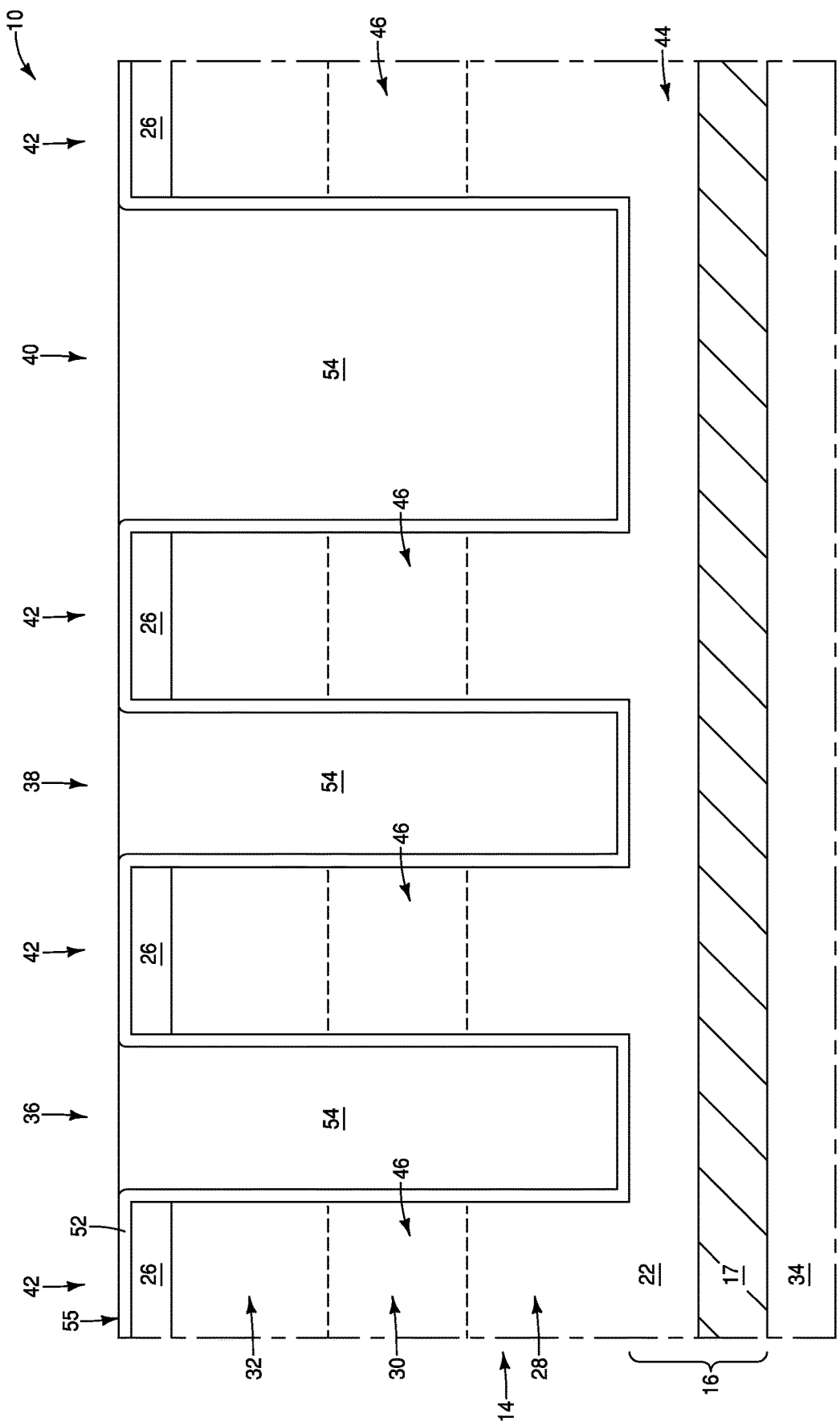

Referring to FIG. 10, a planarizing process (e.g., chemical-mechanical polishing, CMP) is utilized to remove the first material 54 from over the coating material 52, and to form a planarized upper surface 55 extending across the materials 52 and 54.

Figure 11:
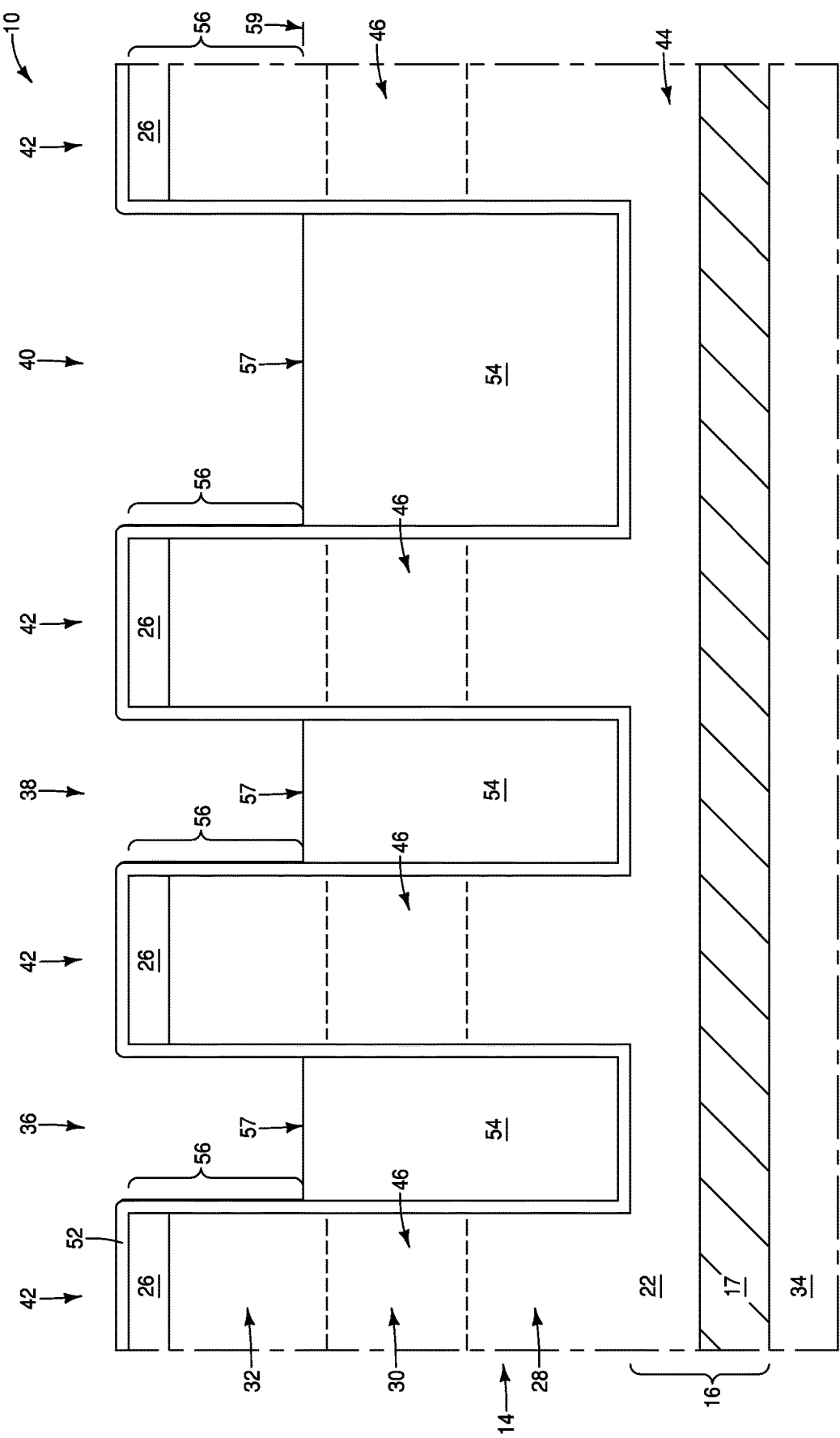

Referring to FIG. 11, the first material 54 is selectively etched relative to the coating material 52. Such recesses upper surfaces 57 of the first material 54 to a first level 59 (which in some embodiments may be referred to as a first elevational level).

The rails 42 have first segments 56 which are above the first level 59.

The first level 59 ultimately sets locations for the tops of transistor gates, as discussed below. Such locations may be at any suitable level relative to an interface between the channel regions 30 and the upper source/drain regions 32. In the shown embodiment, the level 59 is slightly above such interface. In other embodiments, the level 59 may be even with such interface, or below such interface.

Figure 12:
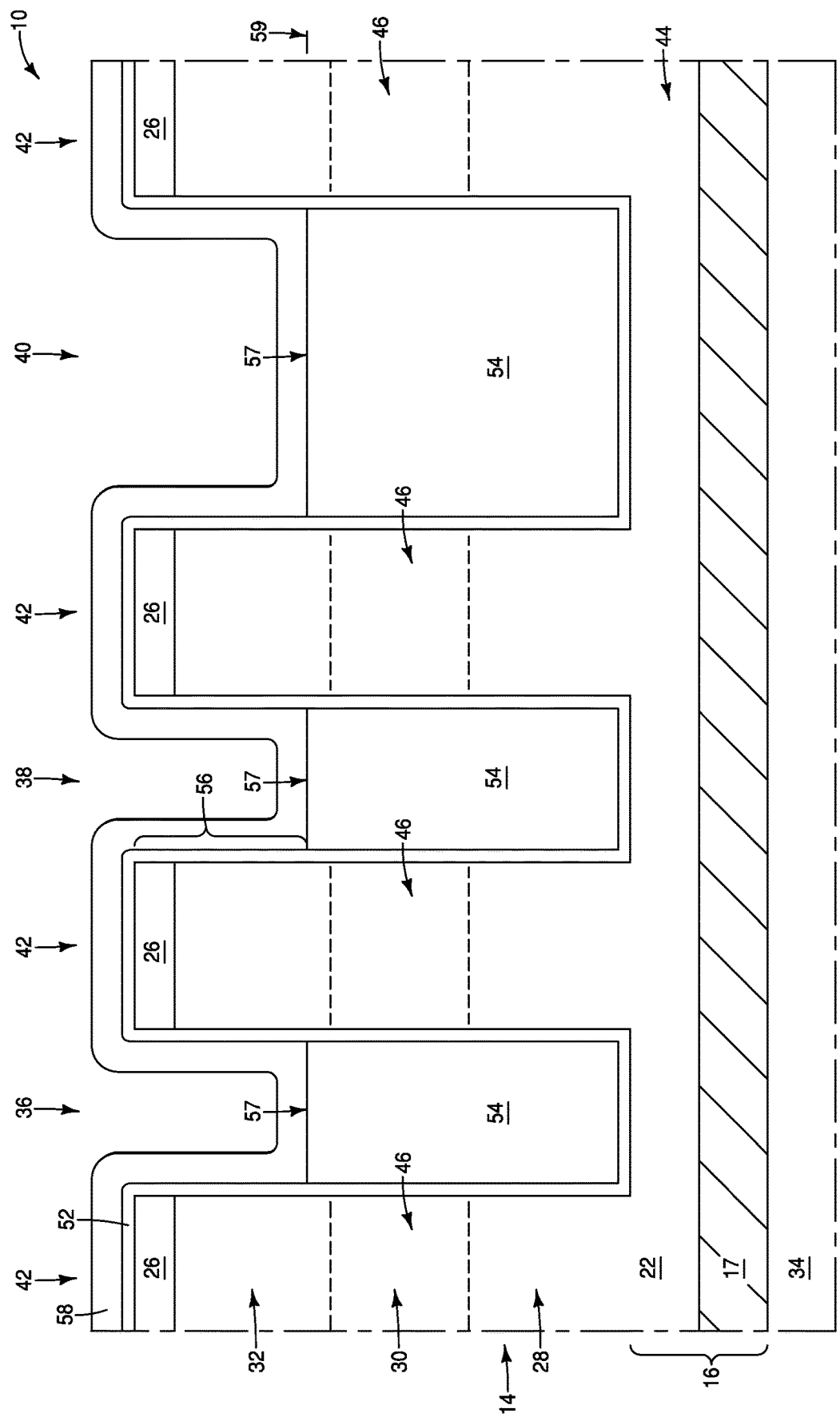

Referring to FIG. 12, spacer material 58 is formed to extend over the rails 42 and within the trenches 36, 38 and 40. The spacer material may comprise an insulative material to which the material 54 may be selectively etched. In some example embodiments, the spacer material 58 may comprise, consist essentially of, or consist of silicon nitride.

Figure 13:
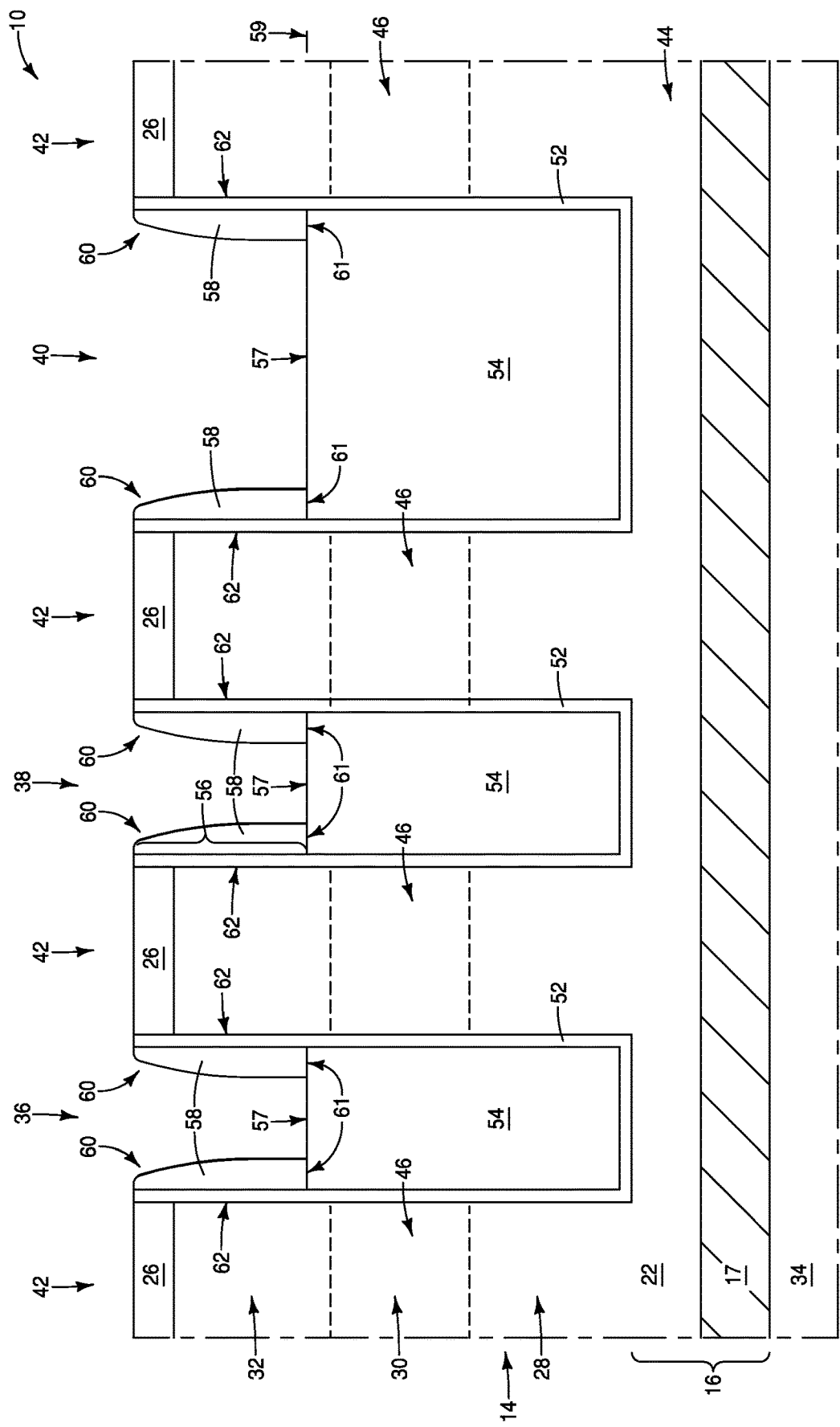

Referring to FIG. 13, the spacer material 58 is anisotropically etched to form spacers 60 along the first segments 56 of the rails 42. In the shown embodiment, the anisotropic etching has removed the materials 52 and 58 from over the protective material 26 to expose upper surfaces of the protective material 26 along the rails 42. The portions of the coating material 52 remaining between the spacers 60 and the first segments 56 of the rails 42 may be referred to as first portions 62 of the coating material. In some embodiments, the etching utilized to pattern the spacers 60 may remove some of the first material 54. Such is not problematic, in that the material 54 will be recessed at a subsequent process step (FIG. 14) anyway.

The spacers 60 have bottom surfaces 61 on the upper surfaces 57 of the first material 54, and accordingly have bottom surfaces 61 at the level 59 of the upper surfaces 57. In some embodiments, the bottom surfaces 61 may be referred to as being at "about" the level 59 to indicate that the bottom surfaces 61 are aligned with the level 59 to within reasonable tolerances of fabrication and measurement. In some embodiments, the upper surfaces 57 of the first material 54 may be considered to calibrate locations of the bottom surfaces 61 such that the bottom surfaces are approximately aligned with the level 59.

Figure 14:
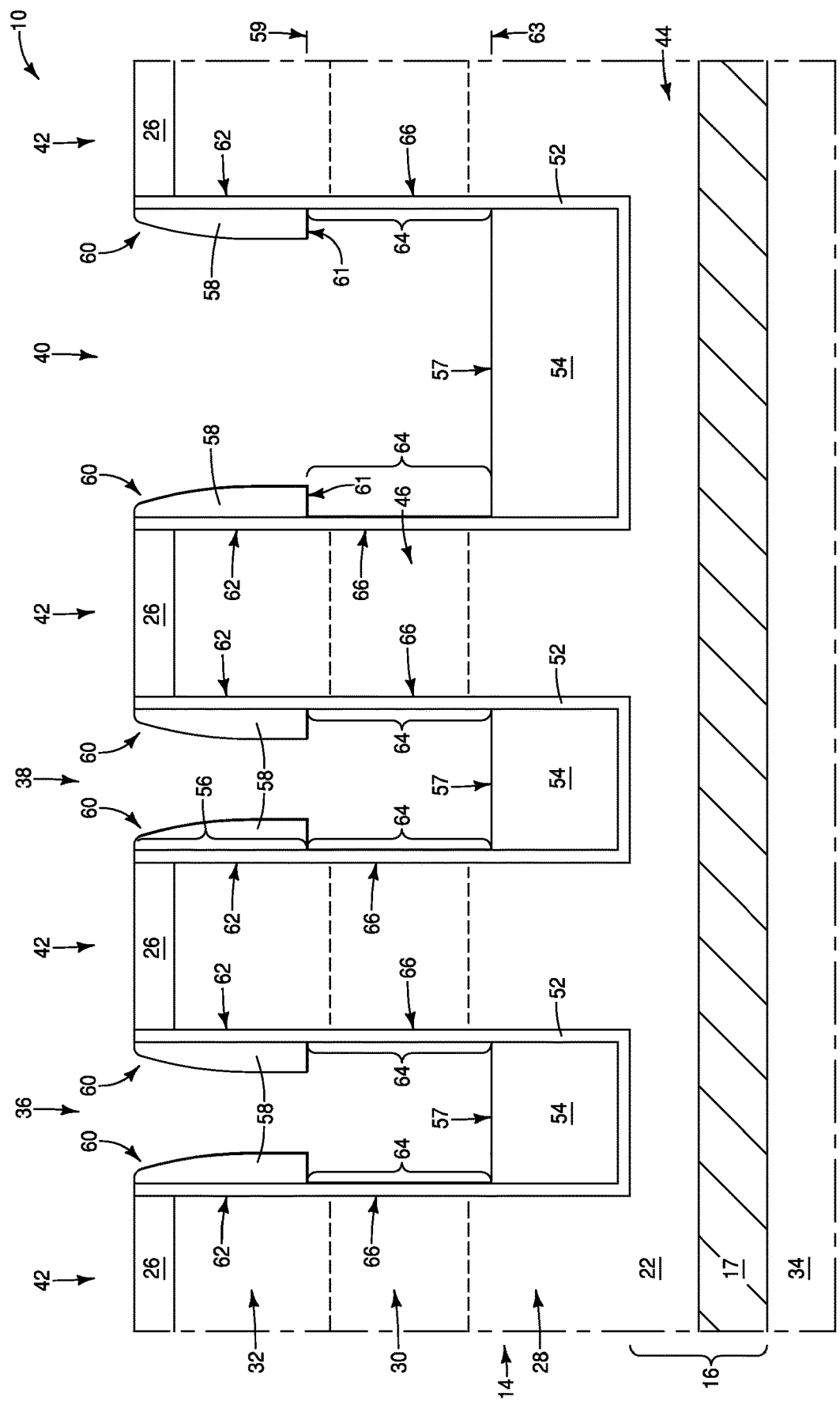

Referring to FIG. 14, the first material 54 is selectively etched relative to the coating material 52, the protective material 26 and the spacer material 58 to recess the upper surfaces 57 of the first material 54 to a second level 63 (which in some embodiments may be referred to as a second elevational level).

The rails 42 have second segments 64 which are between the first and second levels 59 and 63 (i.e., which are between the first segments 56 and the second level 63). The portions of the coating material 52 along the second segments 64 of the rails 42 may be referred to as second portions 66 of the coating material. The second portions of the coating material 52 are exposed at the process stage of FIG. 14; and may be left as-is for incorporation into transistors as gate dielectric, may be covered with additional insulative material suitable for incorporation into gate dielectric, may be removed and replaced with gate dielectric material, may be partially removed, may be partially removed and then covered with additional insulative material of gate dielectric material, etc.

The second level 63 ultimately sets locations for the bottoms of transistor gates, as discussed below. Such locations may be at any suitable level relative to an interface between the channel regions 38 and the lower source/drain regions 28. In the shown embodiment, the level 63 is slightly below such interface. In other embodiments, the level 63 may be even with such interface, or above such interface.

Figure 15:
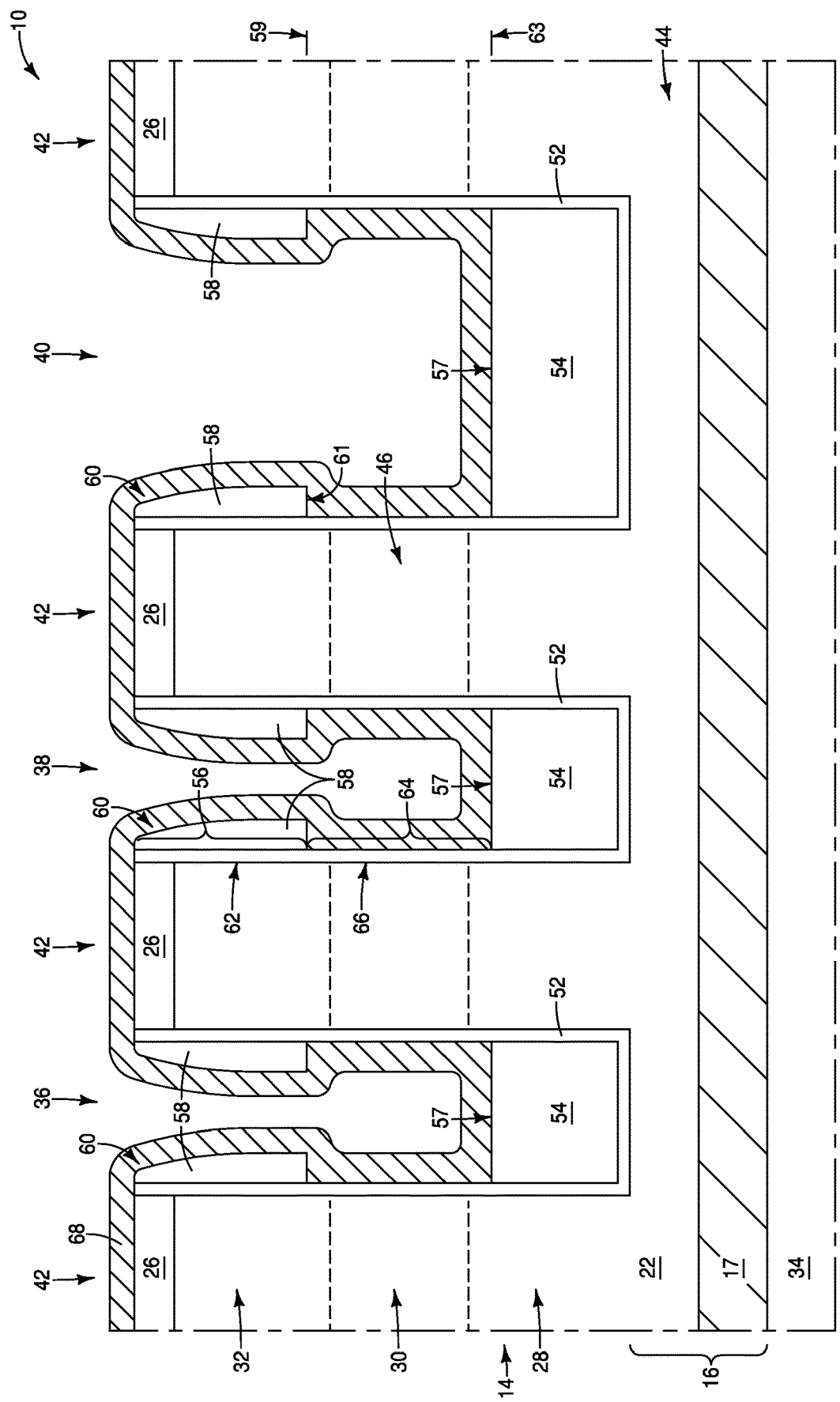

Referring to FIG. 15, conductive material 68 is formed over the rails 42 and within the trenches 36, 38 and 40. The conductive material 68 may ultimately form wordlines, with the regions of the wordlines adjacent the pillars 46 being transistor gates. Accordingly, in some embodiments the conductive material 68 may be referred to as conductive gate material or as conductive wordline material. The conductive material 68 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 68 will be a metal-containing material; such as, for example, a material comprising one or more of titanium, tungsten, titanium nitride, tungsten nitride, etc.

In some embodiments, the conductive material 68 may be considered to line the second segments 64 of the rails 42.

Figure 16:
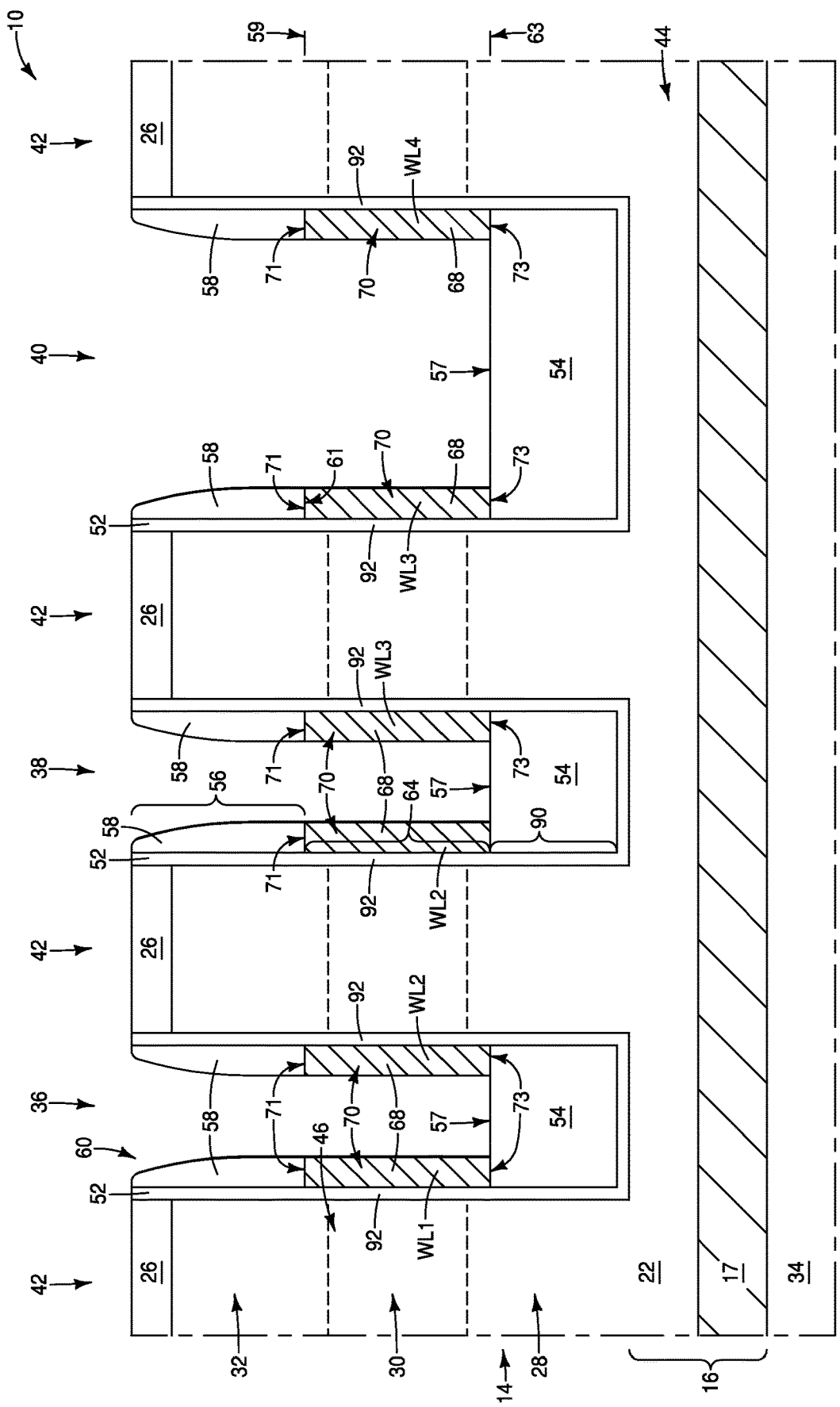

Referring to FIG. 16, the conductive material 68 is etched to pattern such material into components 70 extending along the second segments 64 of the rails 42. The components 70 have upper surfaces 71 against the lower surfaces 61 of the spacers 60, and have bottom surfaces 73 against the upper surfaces 57 of the recessed first material 54. Accordingly, the upper surfaces 71 are at the first level 59 (or at "about" the first level), and the lower surfaces 73 are at the second level 63 (or at "about" the second level). In some embodiments, the lower surfaces 61 of the spacers 60 may be considered to calibrate locations of the upper surfaces 71 of the components 70 such that the upper surfaces are approximately aligned with the level 59; and the upper surfaces 57 of the first material 54 may be considered to calibrate locations of the bottom surfaces 73 of the components 70 such that the bottom surfaces are approximately aligned with the level 63.

It may be desired that the spacers 60 have lateral thicknesses greater than or equal to a desired lateral thickness of the components 70, as such may enable the spacers 60 to be utilized as hardmasks during the patterning of conductive material 68 into the conductive components 70.

The components 70 may comprise transistor gates along the pillars 46. Such transistor gates are spaced from the pillars by the coating material 52. Such coating material may be considered material corresponding to gate dielectric material in the embodiment of FIG. 16. The gates 70 are operatively adjacent the channel regions 30, and electrical properties of the gates may be utilized to control coupling of the source/drain regions 28 and 32 through the channel regions 30 (i.e., the source/drain regions 28 and 32 may be gatedly coupled to one another through the channel regions 30). Accordingly, each of the vertically-extending pillars 46 may be incorporated into a vertical transistor (with the term "vertical transistor" meaning that the transistor has a channel region extending vertically between upper and lower source/drain regions). The bottom source/drain regions 28 of such vertical transistors are coupled with the digit lines 16.

In some embodiments, the components 70 may be incorporated into wordlines that extend in and out of the page relative to the cross-sectional view of FIG. 16. The components 70 on either side of a pillar 42 may be together comprised by a single wordline, with such components joining to one another at a location outside of the illustrated cross-section of FIG. 16. For instance, the illustrated components 70 are shown incorporated into wordlines WL1, WL2, WL3 and WL4.

Figure 17:
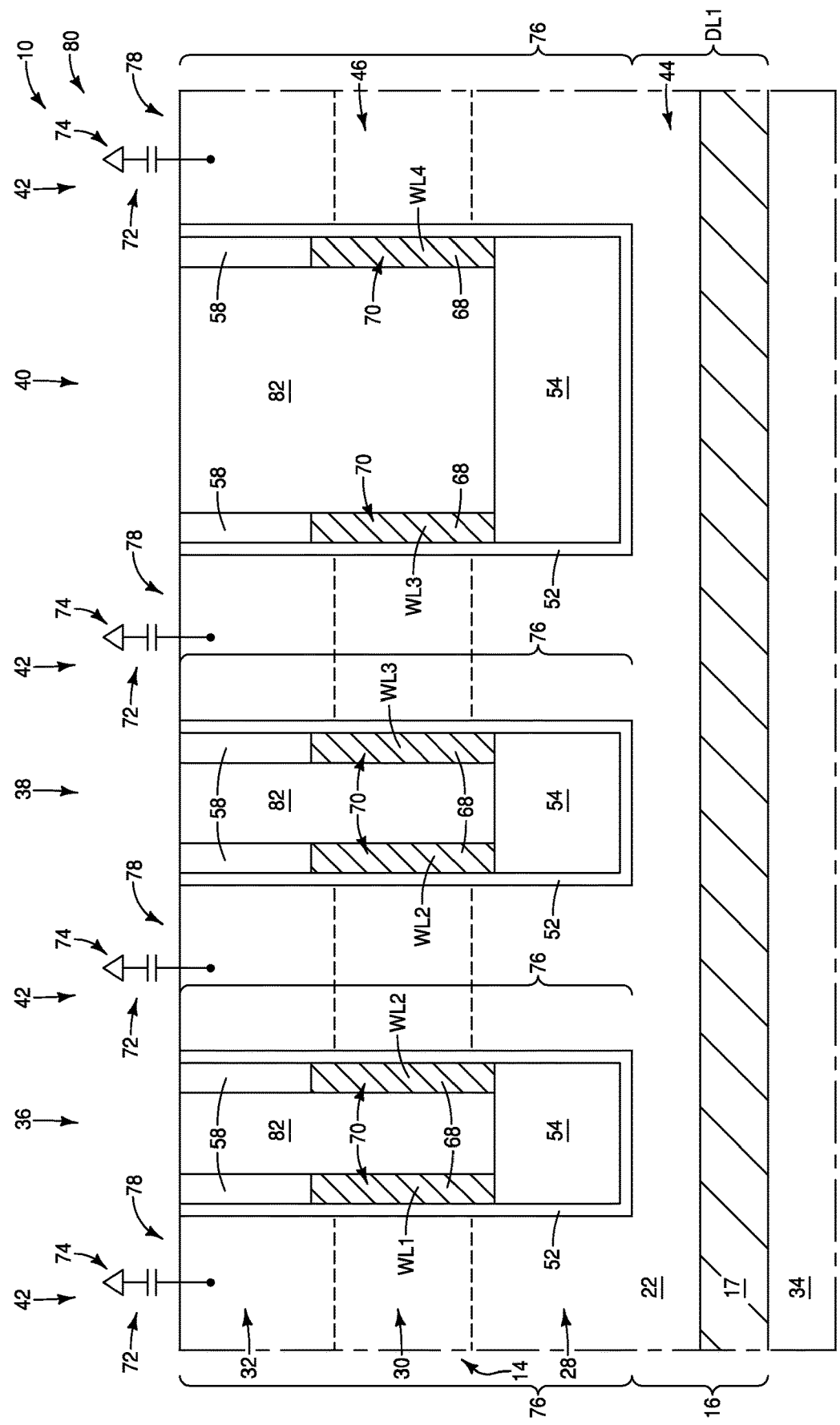

Referring to FIG. 17, the protective material 26 (FIG. 16) is removed from over the upper source/drain regions 32 to expose such regions. Subsequently, the upper source/drain regions 32 are coupled with charge-storage devices 72. The charge-storage devices are illustrated to be capacitors, but it is to be understood that the devices 72 may be any suitable charge-storage devices. In the shown embodiment in which the devices 72 are capacitors, such capacitors have first nodes coupled with the upper source/drain regions 32, and have second nodes coupled with a reference voltage 74. Such reference voltage may be ground, or any other suitable reference voltage.

FIG. 7 (discussed above) shows that the protective material 26 extends across the upper source/drain regions 32, and also across intervening regions 48 between the upper source/drain regions. The protective material 26 may or may not be removed from across the intervening regions 48 as it is removed from over the upper source/drain regions 32 at the processing stage of FIG. 17.

FIG. 17 shows an insulative material 82 formed over the first material 54 within the trenches 36, 38 and 40. The insulative material 82 may comprise any suitable composition(s), and in some embodiments may comprise, consist essentially of, or consist of silicon dioxide.

The digit line 16 of FIG. 17 may be considered to be an example of the many digit lines which may be associated with a memory array, and is illustrated to be a digit line DL1 in the embodiment of FIG. 17. The digit line DL1 extends along a first direction, corresponding to the direction of the axis 5 of FIG. 1. The wordlines WL1-WL4 may be considered to be examples of the many wordlines which may be associated with the memory array. The wordlines extend along a second direction corresponding to the direction of the axis 7 of FIG. 1. The regions 28, 30 and 32 within the pillars 46 may be considered to be comprised by vertical transistors 76 which are gated by gates along the wordlines WL1-WL4. The vertical transistors 76, together with the charge-storage devices 72, may be considered to form memory cells 78 of a memory array 80 (e.g., a DRAM array).

Figure 18:
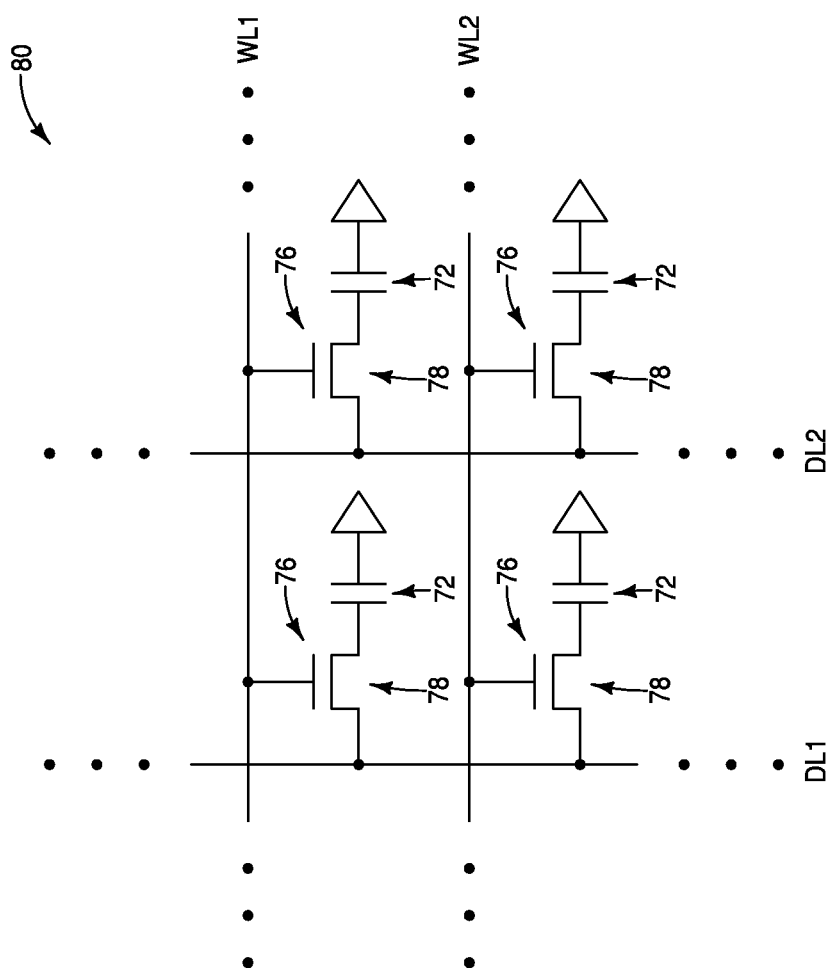
FIG. 18 is a schematic diagram of a region of an example memory array.

FIG. 18 schematically illustrates a region of the example DRAM array 80. Such region comprises a plurality of the memory cells 78, with each of the memory cells including a capacitor 72 and a transistor 76. The illustrated region of the memory array comprises two digit lines (DL1 and DL2) and two wordlines (WL1 and WL2), together with four memory cells. It is to be understood that the memory array may have any suitable number of wordlines, digit lines and memory cells.

Figure 19:
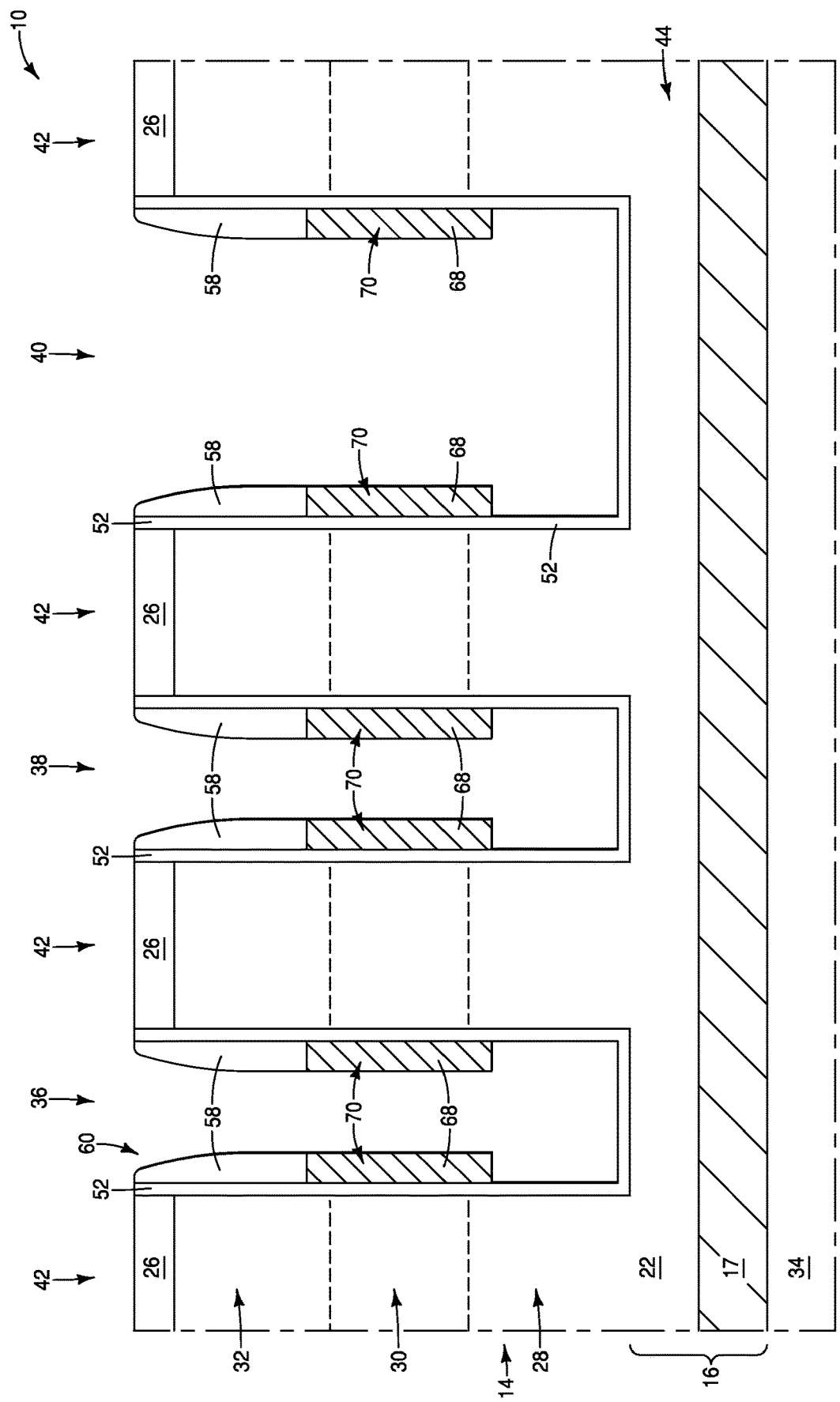
FIGS. 19 and 20 are diagrammatic cross-sectional side views of example process stages that may follow the process stage of FIG. 16.
Figure 20:
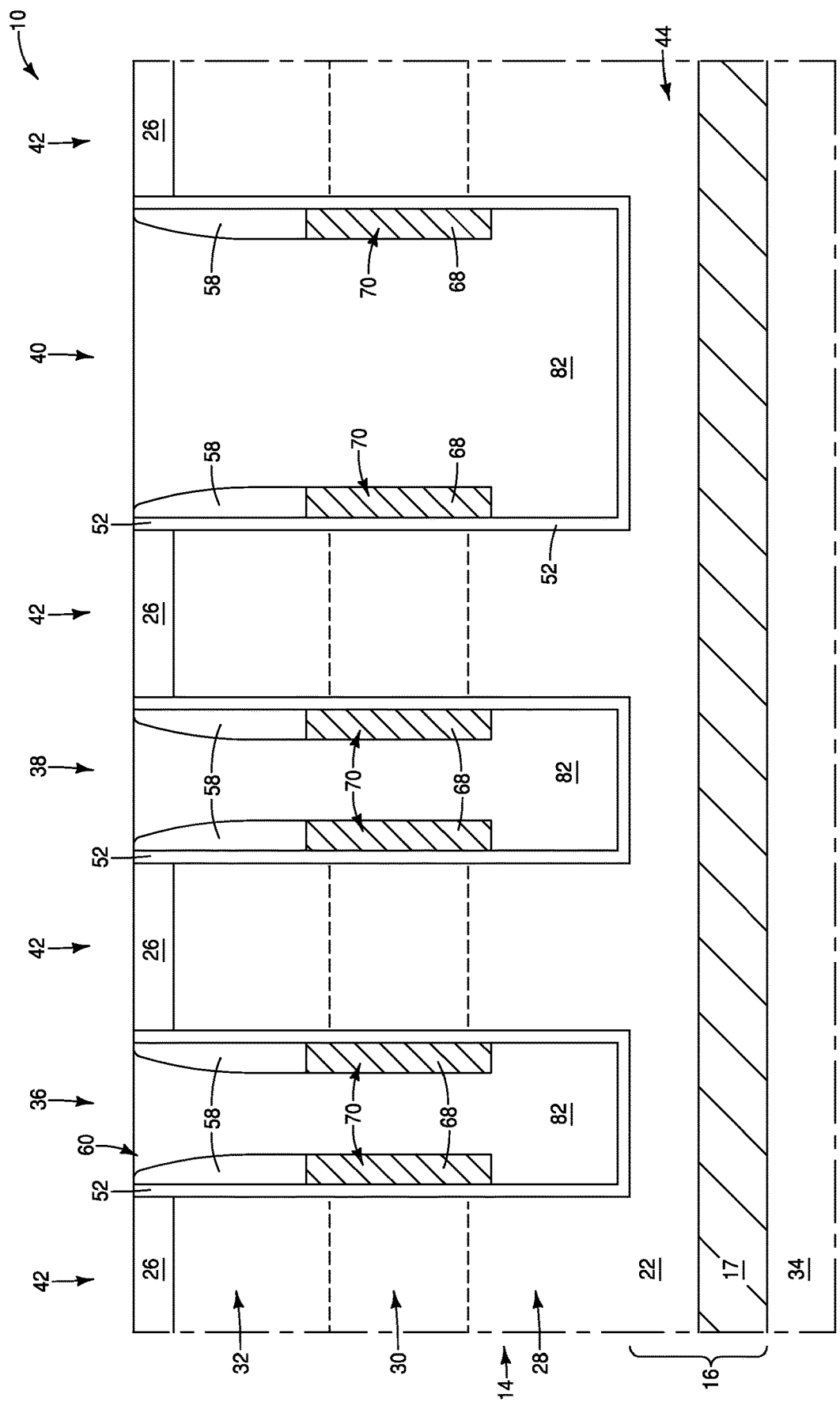

In some embodiments, the first material 54 may remain in a final construction, as shown in FIG. 17. In other embodiments, the first material 54 may be a sacrificial material which is removed. For instance, FIG. 19 shows construction 10 at a process stage which may follow that of FIG. 16, and shows the material 54 (FIG. 16) removed. The trenches 36, 38 and 40 may be subsequently filled with the insulative material 82, as shown in FIG. 20. If the first material 54 is to remain in a final construction, the first material may be an insulative material (e.g., silicon dioxide). If the first material 54 is a sacrificial material, the first material may have any electrical properties (e.g., may be insulative, conductive, etc.), and may be chosen solely for its etch properties.

The processing stage of FIG. 14 exposes the second portion 66 of the coating material 52. In the illustrated embodiment of FIGS. 15-17, such second portion 66 becomes gate dielectric material of vertical transistors. In other embodiments, the exposed second portion of the coating material 52 may be removed and replaced with other material which is subsequently utilized as the gate dielectric material within the vertical transistors. Examples of such other embodiments are described with reference to FIGS. 21-25.

Figure 21:
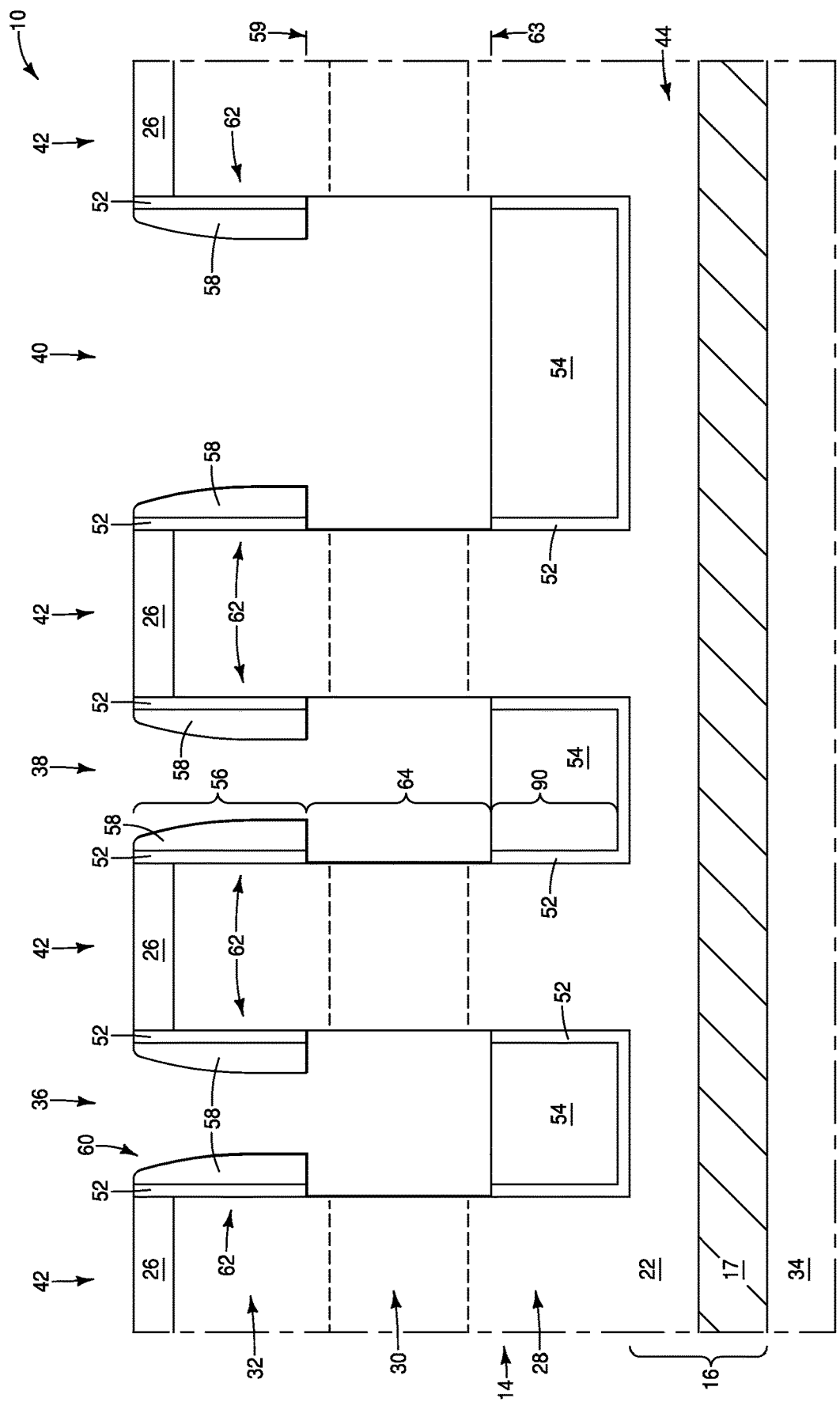
FIGS. 21-24 are diagrammatic cross-sectional side views of example process stages that may follow the process stage of FIG. 14.

Referring to FIG. 21, construction 10 is shown at a processing stage which may follow that of FIG. 14. Each of the rails 42 may be considered to comprise the first segment 56, the second segment 64, and a third segment 90 under the second segment 64. The segments 56, 64 and 90 may be referred to as upper, middle and lower segments of the rails; with the upper segments 56 extending from tops of the rails to about the level 59, the middle segments 64 extending from about the level 63 to the about level 59, and the lower segments 64 extending from bottoms of the rails to about the level 63.

The coating material 52 is removed from along the middle segments 64 of the rails 42, and remains along the upper segments 56 and the lower segments 90. In some embodiments, the coating material 52 of FIG. 21 may be referred to as a first insulative material.

Figure 22:
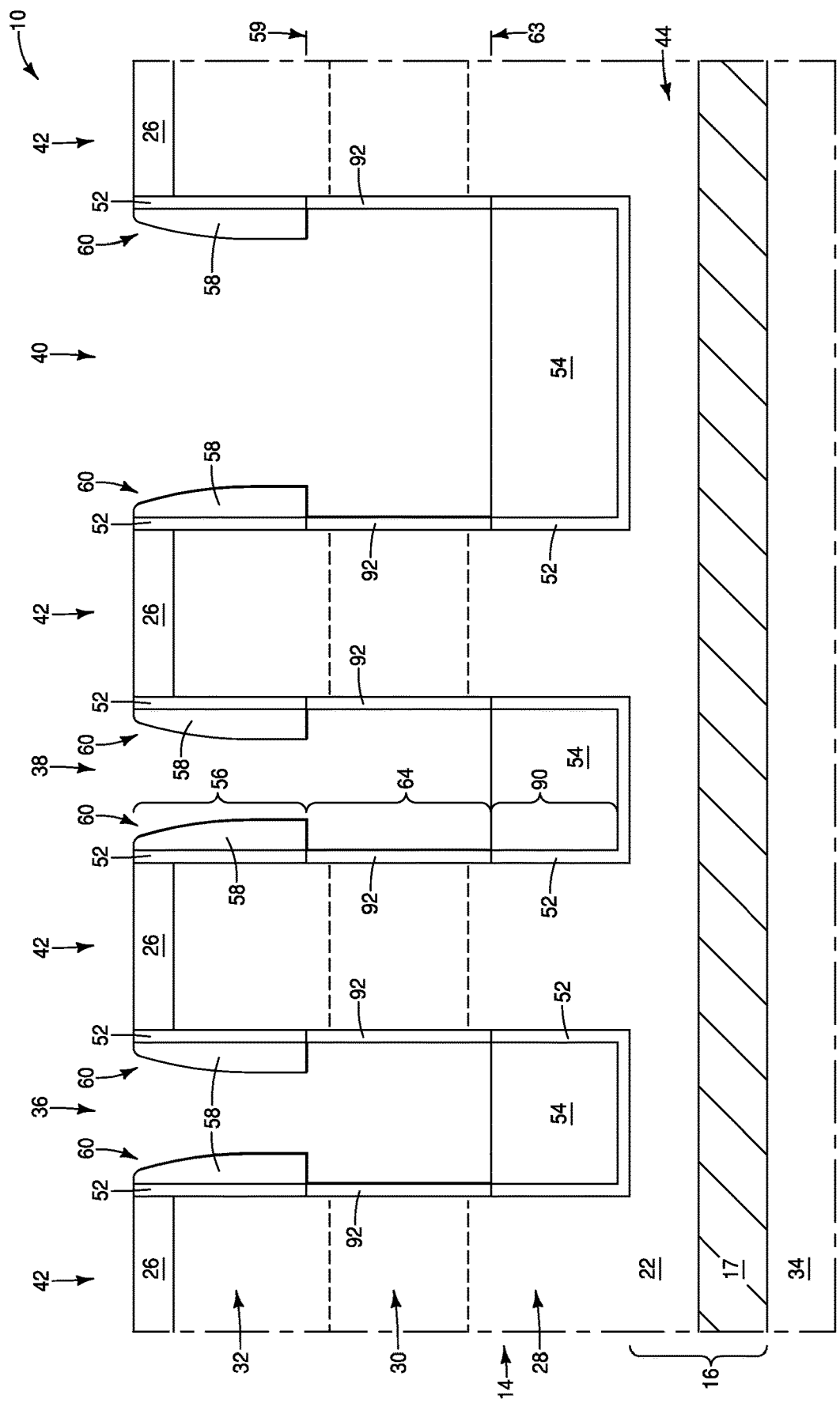

Referring to FIG. 22, a second insulative material 92 is formed along the middle regions 64 of the rails 42. The second insulative material 92 may have a different composition than the first insulative material 52 and/or may have a different thickness than the first insulative material 52. Example differences in thicknesses between the materials 92 and 52 are described in more detail below with reference to FIGS. 25 and 26. Example differences in composition may result from the first insulative material 52 being chosen for having suitable etch-resistive properties (specifically, for being resistant to etches utilized to adjust upper levels of material 54, with examples of such etches being described above with reference to FIGS. 11 and 14), while the insulative material 92 is chosen for having properties suitable for utilization as gate dielectric material within vertical transistors analogous to the transistors described above with reference to FIG. 17. In some embodiments, the first insulative material 52 may comprise, consist essentially of, or consist of one or more of aluminum oxide, hafnium oxide, zirconium oxide, carbon-doped silicon nitride, boron-doped silicon nitride, carbon-doped silicon dioxide, etc.; and the second insulative material 92 may comprise, consist essentially of, or consist of silicon dioxide.

In some embodiments, the spacers 60 of FIG. 22 may be considered to comprise a third insulative material 58 which is different than one or both of the insulative materials 52 and 92. For instance, the insulative material 58 may comprise, consist essentially of, or consist of silicon nitride, while the insulative materials 52 and 92 comprise insulative oxides.

In some embodiments, the material 54 of FIG. 22 (i.e., the material within the intervening gaps between the rails 42), may be considered to be a third insulative material which is different than one or both of the insulative materials 52 and 92. In some embodiments, the material 52 may comprise a high-k dielectric material, and the materials 54 and 92 may both comprise, consist essentially of, or consist of silicon dioxide.

Figure 23:
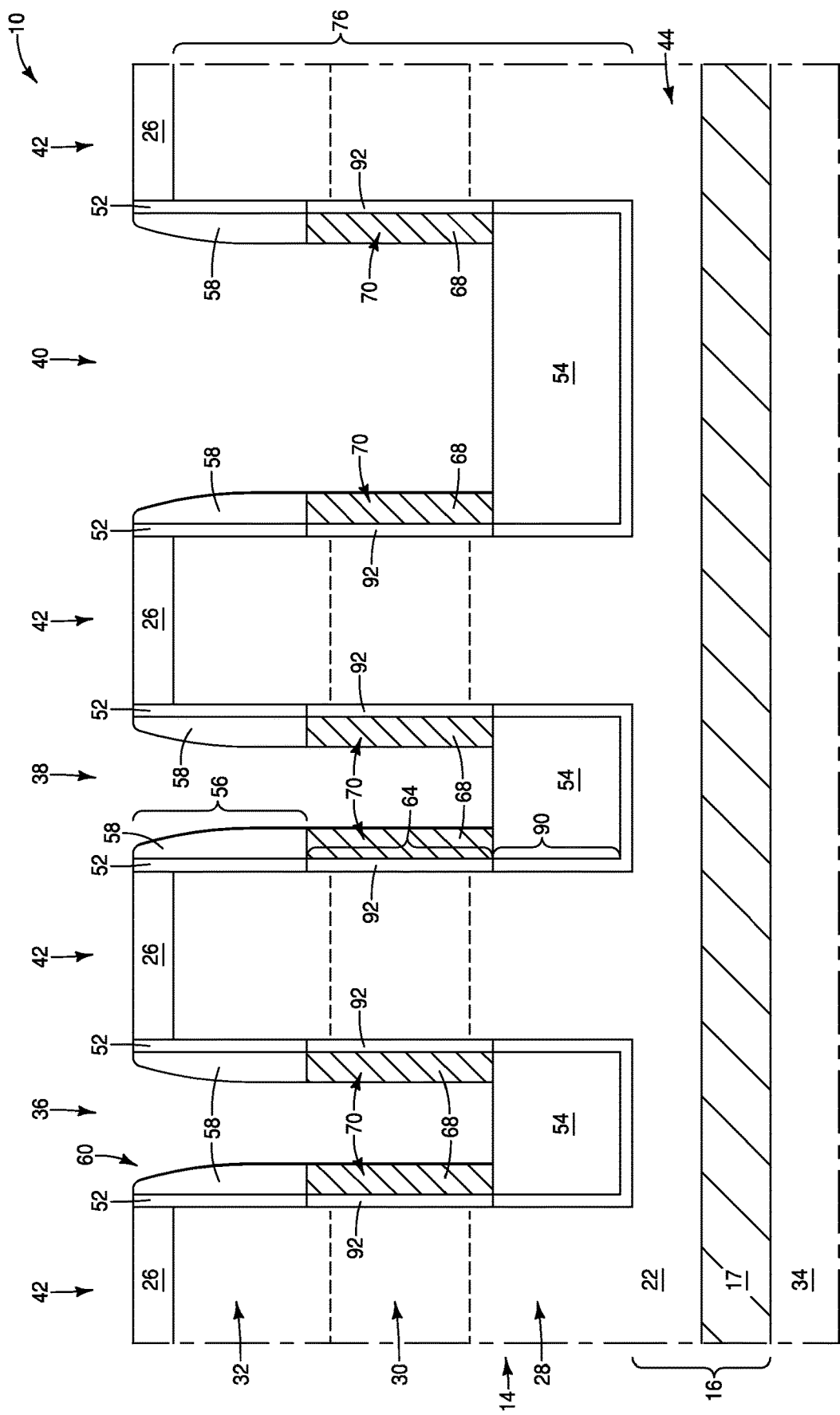
Figure 24:
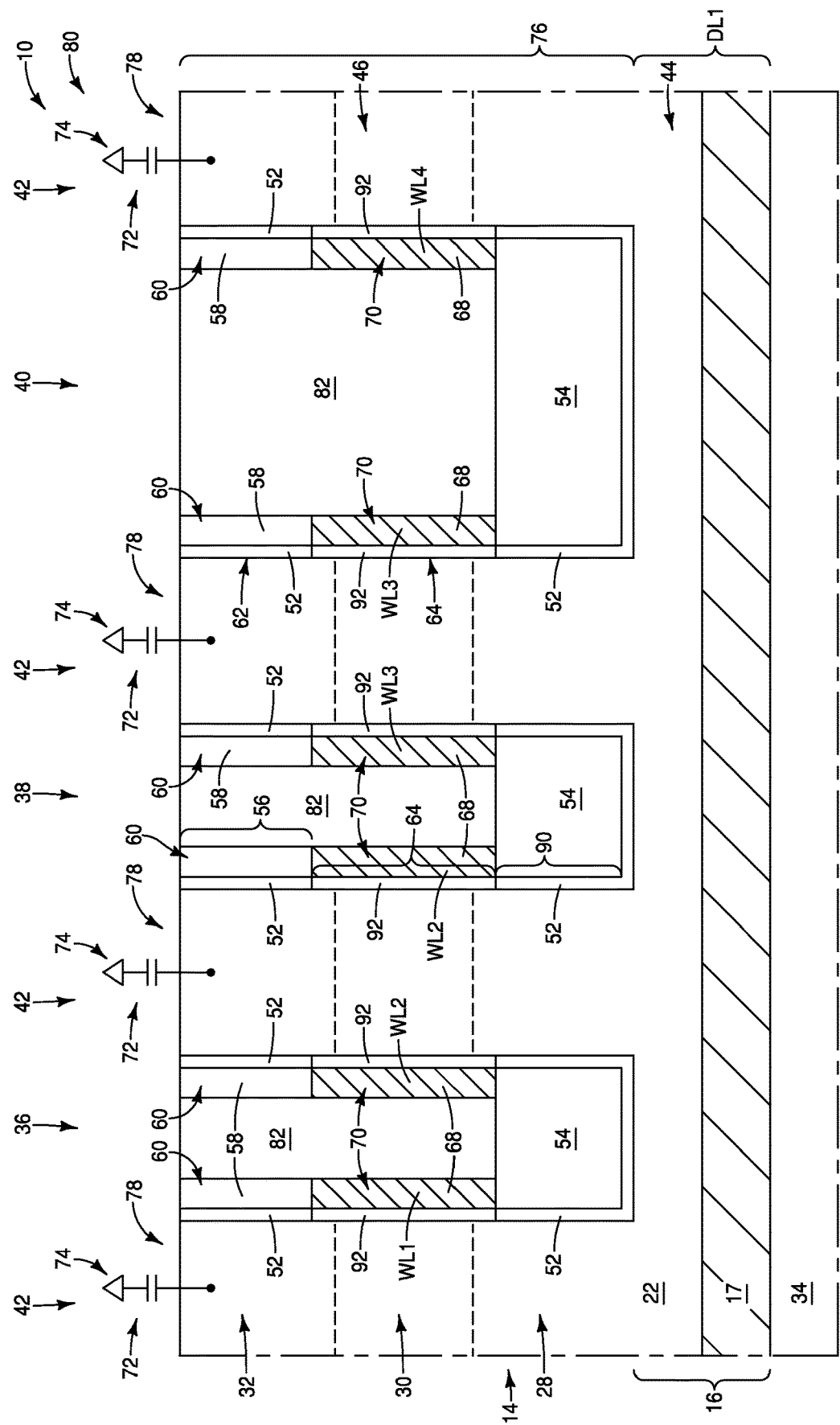

Referring to FIG. 23, the conductive material 68 is formed along the middle segments 64 of the rails 42, and is patterned into the components 70. Such components 70 may comprise wordlines the type described above with reference to FIG. 17. The material 68 may be formed and patterned utilizing processing analogous to that described above with reference to FIGS. 15 and 16.

The source/drain regions 28 and 32, together with the channel regions 30, form vertical transistors 76 analogous to those discussed above with reference to FIG. 17. Such vertical transistors may be incorporated into a memory array 80 analogous that described above with reference to FIGS. 17 and 18; with an example region of an example memory array 80 being shown in FIG. 24.

As discussed above with reference to FIG. 22, the second insulative material 92 may comprise a different thickness than the first insulative material 52. Examples of embodiments in which the materials 52 and 92 comprise different thicknesses relative to one another are described with reference to FIGS. 25 and 26.

Referring to FIG. 25, the first insulative material 52 is shown to comprise a first thickness $T_1$, and the second insulative material 92 is shown to comprise a second thickness $T_2$ which is greater than the first thickness. The second thickness may be greater than the first thickness by any suitable amount, and in some embodiments may be greater than the first thickness by at least about 5 Å, at least about 10 Å, at least about 50 Å, etc.

Referring to FIG. 26, such shows an embodiment in which the first thickness $T_1$ is greater than the second thickness $T_2$. The first thickness may be greater than the second thickness by any suitable amount, and in some embodiments may be greater than the second thickness by at least about 5 Å, at least about 10 Å, at least about 50 Å, etc.

The embodiments of FIGS. 25 and 26 may comprise first and second insulative materials 52 and 92 which are the same composition as one another, or may comprise first and second insulative materials 52 and 92 which are of different compositions relative to one another.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a method of forming an integrated assembly. A structure is provided which has first panels of semiconductor material and second panels which are insulative. The first and second panels extend along a first direction, and alternate with one another along a second direction which crosses the first direction. Trenches are formed to extend into the structure. The trenches extend along the second direction. The trenches form an upper portion of the structure into rails. The rails comprise pillars of the semiconductor material. Lower portions of the semiconductor material of the first panels remain under the rails and the trenches, and are configured as semiconductor-material lines passing under the trenches and the pillars. A first material is formed within the trenches. The first material has an upper surface at a first level. First segments of the rails are above the first level. Spacers are formed along the first segments of the rails. The first material is recessed within the trenches until the upper surface is at a second level. Second segments of the rails are between the first segments and the second level. Conductive material is formed along the second segments of the rails.

Some embodiments include a method of forming an integrated assembly. A structure is provided which has first panels of semiconductor material and second panels of insulative material. The first and second panels extend along a first direction, and alternate with one another along a second direction which crosses the first direction. A protective material is formed to extend across an upper surface of the structure. Trenches are formed to extend through the protective material and into the structure. The trenches extend along the second direction. The trenches form rails from the protective material and an upper portion of the structure. The rails comprise pillars of the semiconductor material. A coating material is formed to extend over the rails and along interior surfaces of the trenches. A first material is formed over the coating material and within the trenches. The first material is etched selectively relative to the coating material to recess an upper surface of the first material to a first level. First segments of the rails are above said first level. Spacers are formed along the first segments of the rails. First portions of the coating material are between the spacers and the first segments of the rails. The first material is etched selectively relative to the coating material and the spacers to recess the first material within the trenches until the upper surface is at a second level. Second segments of the rails are between the first segments and the second level. Second portions of the coating material cover the second segments of the rails. Conductive material is formed within the trenches. The conductive material lines the second segments of the rails.

Some embodiments include an integrated assembly having digit lines extending along a first direction, and rails over the digit lines. The rails extend along a second direction which crosses the first direction. The rails include semiconductor-material pillars alternating with intervening insulative regions. The rails and associated semiconductor-material pillars have upper, middle and lower segments in descending order from tops of the rails and the associated semiconductor-material pillars. A first insulative material is along the upper and lower segments of the rails. A second insulative material is along the middle segments of the rails. The second insulative material differs from the first insulative material in one or both of thickness and composition. Conductive gate material is along the middle segments of the rails and is spaced from the middle segments by the second insulative material. Channel regions are within the middle segments of the semiconductor-material pillars, upper source/drain regions are within the upper segments of the semiconductor-material pillars and lower source/drain regions are within the lower segments of the semiconductor-material pillars. The upper and lower source/drain regions are gatedly coupled to one another through the channel regions.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming an integrated assembly, comprising:
    providing a structure having first panels of semiconductor material and second panels which are insulative; the first and second panels extending along a first direction, and alternating with one another along a second direction which crosses the first direction;
    forming trenches extending into the structure along the second direction; the trenches forming an upper portion of the structure into rails comprising pillars of the semiconductor material;
    forming a first material within the trenches, the first material having an upper surface at a first level; first segments of the rails being above the first level;
    forming spacers along the first segments of the rails;
    recessing the first material within the trenches until the upper surface is at a second level; second segments of the rails being between the first segments and the second level; and
    forming conductive material along the second segments of the rails.

2. The method of claim 1 further comprising forming an insulative material along the second segments of the rails prior to forming the conductive material along the second segments of the rails.

3. The method of claim 2 wherein the insulative material is formed along the second segments of the rails prior to the recessing of the first material within the trenches.

4. The method of claim 2 wherein the insulative material is formed along the second segments of the rails after the recessing of the first material within the trenches.

5. The method of claim 1 further comprising removing the first material.

6. The method of claim 1 wherein the first material comprises silicon dioxide and the spacers comprise silicon nitride.

7. The method of claim 1 further comprising:
forming protective material over the first and second panels prior to forming the trenches; upper portions of the rails comprising the protective material as protective caps;
removing at least some portions of the protective caps to expose upper regions of the pillars of the semiconductor material; and
coupling charge-storage devices with said exposed upper regions.

8. The method of claim 1 further comprising:
forming a coating material over the first and second panels and along interior surfaces of the trenches prior to forming the first material within the trenches;
forming the first material to fill the trenches and cover the coating material;
removing the first material from over the coating material with a planarization process; and
selectively removing the first material relative to the coating material to recess the upper surface of the first material to the first level.

9. The method of claim 8 wherein:
the coating material comprises one or more of aluminum oxide, hafnium oxide, zirconium oxide, carbon-doped silicon nitride, boron-doped silicon nitride and carbon-doped silicon dioxide; and
the first material comprises silicon dioxide.

10. An integrated assembly, comprising:
rails comprising semiconductor-material pillars alternating with intervening insulative regions; the rails and associated semiconductor-material pillars having upper, middle and lower segments;
a first insulative material along the upper and lower segments of the rails;
a second insulative material along the middle segments of the rails; the second insulative material differing from the first insulative material in one or both of thickness and composition;
conductive gate material along the middle segments of the rails and spaced from the middle segments by the second insulative material; and
channel regions within the middle segments of the semiconductor-material pillars.

11. The integrated assembly of claim 10 further comprising upper source/drain regions within the upper segments of the semiconductor-material pillars and lower source/drain regions within the lower segments of the semiconductor-material pillars; the upper and lower source/drain regions being gatedly coupled to one another through the channel regions.

12. The integrated assembly of claim 10 wherein the first and second insulative materials differ from one another in thickness.

13. The integrated assembly of claim 10 wherein the first insulative material is thicker than the second insulative material by at least about 5 Å.

14. The integrated assembly of claim 10 wherein the first insulative material is thinner than the second insulative material by at least about 5 Å.

15. The integrated assembly of claim 10 wherein the first and second insulative materials differ from one another in composition.

16. The integrated assembly of claim 15 wherein the first insulative material comprises one or more of aluminum oxide, hafnium oxide, zirconium oxide, carbon-doped silicon nitride, boron-doped silicon nitride and carbon-doped silicon dioxide; and wherein the second insulative material consists of silicon dioxide.

17. The integrated assembly of claim 10 further comprising spacers along the upper segments of the rails and spaced from the upper segments by the first insulative material.

18. The integrated assembly of claim 17, wherein the first insulative material comprises one or more oxides, and the spacers comprise silicon nitride; and wherein the conductive gate material is configured as wordline structures having top surfaces directly against the spacers.

19. The integrated assembly of claim 10 wherein the rails are spaced from one another by intervening gaps; and further comprising third insulative material within lower portions of the intervening gaps and along the lower segments of the rails; the conductive gate material being configured as wordline structures having bottom surfaces directly against the third insulative material; the third insulative material comprising a different composition than the first insulative material.

* * * * *